(12) United States Patent
Nakao et al.

(10) Patent No.: US 9,685,807 B2
(45) Date of Patent: Jun. 20, 2017

(54) BATTERY CONTROL DEVICE

(71) Applicant: Hitachi Automotive Systems, Ltd., Ibaraki (JP)

(72) Inventors: Ryouhei Nakao, Tokyo (JP); Shinji Imai, Tokyo (JP); Keiichiro Ohkawa, Ibaraki (JP); Naoyuki Igarashi, Ibaraki (JP); Takahiro Soma, Ibaraki (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 99 days.

(21) Appl. No.: 14/655,371

(22) PCT Filed: Jan. 27, 2014

(86) PCT No.: PCT/JP2014/051614
§ 371 (c)(1),
(2) Date: Jun. 25, 2015

(87) PCT Pub. No.: WO2014/156265
PCT Pub. Date: Oct. 2, 2014

(65) Prior Publication Data
US 2015/0357852 A1 Dec. 10, 2015

(30) Foreign Application Priority Data
Mar. 29, 2013 (JP) ................................ 2013-073505

(51) Int. Cl.
*H02J 7/00* (2006.01)
*G01R 31/36* (2006.01)
(Continued)

(52) U.S. Cl.
CPC .......... *H02J 7/0057* (2013.01); *B60L 3/0046* (2013.01); *B60L 3/12* (2013.01); *B60L 11/1857* (2013.01); *B60L 11/1861* (2013.01); *G01R 31/3624* (2013.01); *G01R 31/3675* (2013.01); *G01R 31/3679* (2013.01); *H01M 10/48* (2013.01); *H02J 7/0047* (2013.01); *B60L 2240/545* (2013.01); *B60L 2240/547* (2013.01);
(Continued)

(58) Field of Classification Search
CPC .. H02J 7/0047; H02J 7/0057; H02J 2007/005; G01R 31/3624; G01R 31/3675; G01R 31/3679
USPC ............................ 320/132, 134, 162; 702/63
See application file for complete search history.

(56) References Cited

U.S. PATENT DOCUMENTS 9,263,773 B2\* 2/2016 Nakamura ........... G01R 31/361
2012/0293131 A1 11/2012 Nakamura et al.

FOREIGN PATENT DOCUMENTS

| JP | 2009-236629 A | 10/2009 |
|---|---|---|
| JP | 2010-066232 A | 3/2010 |

(Continued)

*Primary Examiner* — Arun Williams
*Assistant Examiner* — Aaron Piggush
(74) *Attorney, Agent, or Firm* — Volpe and Koenig, P.C.

(57) ABSTRACT

Provided is a battery control device that can accurately detect a state of charge even if characteristics relating to the state of charge change as a result of battery degradation. This battery control device is provided with map data describing the correspondence relationship between an open-circuit voltage and a state of charge of the battery and outputs different state-of-charge values for the same open-circuit voltage according to the amount of elapsed time.

6 Claims, 21 Drawing Sheets

(51) Int. Cl.
*H01M 10/48* (2006.01)
*B60L 3/00* (2006.01)
*B60L 3/12* (2006.01)
*B60L 11/18* (2006.01)

(52) U.S. Cl.
CPC ..... *B60L 2240/549* (2013.01); *B60L 2260/44* (2013.01); *G01R 31/3651* (2013.01); *H02J 2007/005* (2013.01); *Y02T 10/7005* (2013.01); *Y02T 10/705* (2013.01); *Y02T 10/7044* (2013.01)

(56) References Cited

FOREIGN PATENT DOCUMENTS

| | | |
|---|---|---|
| JP | 2011-151983 A | 8/2011 |
| JP | 2012-057956 A | 3/2012 |
| WO | 2011/090020 A1 | 7/2011 |

\* cited by examiner

| OCV$_{00}$ | OCV$_{01}$ | ... | OCV$_{0n}$ |
|---|---|---|---|
| OCV$_{10}$ | OCV$_{11}$ | ... | OCV$_{1n}$ |
| ... | ... | ... | ... |
| OCV$_{m0}$ | OCV$_{m1}$ | ... | OCV$_{mn}$ |

BATTERY CONTROL DEVICE

TECHNICAL FIELD

The present invention relates to techniques of battery control devices. In particular, the present invention relates to techniques for calculating state of charge of batteries.

BACKGROUND ART

In order to safely use batteries included in battery systems and to utilize the maximum battery performance, battery systems equipped in electric vehicles (EV), in plugin hybrid electric vehicles (PHEV), and in hybrid electric vehicles (HEV) include battery control devices that detect electric voltages, temperatures, and electric currents of the battery and that calculate battery parameters such as stets of charge (SOC) or state of health (SOH) of the battery according to the detected values.

Battery parameters such as relationships between SOC and open circuit voltage (OCV) of battery or internal resistance characteristics may vary depending on SOH or deterioration modes of battery. In order to precisely identify the battery parameters, it is necessary to detect changes in battery characteristics along with deterioration and to reflect the change when calculating the battery parameters.

Patent Literature 1 listed below describes a technique for detecting, by detecting the change rate of relationship between SOC and OCV (dOCV/dSOC) and by comparing the change rate with that of before the battery is deteriorated, changes of the relationship between SOC and OCV as the battery is deteriorated.

CITATION LIST

Patent Literature

Patent Literature 1: JP Patent Publication (Kokai) 2010-066232 A

SUMMARY OF INVENTION

Technical Problem

Battery is deteriorated chronologically depending on the state of preservation or usage histories of the battery within the elapsed time. The relationship between SOC and OCV when the battery is deteriorated has a characteristic which is different from that of when the battery is not deteriorated. Since the battery parameter is calculated according to the relationship between SOC and OCV, it is necessary to reflect, into the calculation of battery parameters, the relationship between SOC and OCV which has changed in the deterioration. Patent Literature 1 above discloses a technique for detecting deteriorations of batteries. However, it does not disclose how to reflect, into the calculation of battery parameters, the relationship between SOC and OCV after the change when the battery is deteriorated.

The present invention is made in the light of the above-described technical problems. It is an objective of the present invention to provide a battery control device that is capable of accurately detect battery parameters such as SOC even after the relationship between SOC and OCV is changed due to deterioration of the battery.

Solution to Problem

A battery control device according to the present invention comprises: a controller that outputs, using a SOC-OCV characteristic indicating a relationship between open circuit voltage and state of charge of battery, information about a state of charge of a battery or of an assembled battery according to a voltage of the battery or to a voltage of the assembled battery, the assembled battery being configured by connecting a plurality of the batteries, wherein the controller acquires a plurality of pairs of: an amount of state of the battery or of the assembled battery calculated on the basis of one or both of a voltage of the battery or a voltage of the assembled battery and an electric current flowing through the battery; and an open circuit voltage of the battery or of the assembled battery that is calculated corresponding to the amount of state,
wherein the controller corrects the SOC-OCV characteristic according to the acquired plurality of pairs and according to characteristic that indicates a relationship between amount of state of the battery or of the assembled battery and open circuit voltage, and wherein the controller outputs different states of charge depending on progress of time even if the voltage of the battery or the voltage of the assembled battery is same.

Advantageous Effects of Invention

With the battery control device according to the present invention, the relationship between OCV and SOC is modified depending on the deterioration of the battery. Thus it is possible to calculate the state of charge keeping up the progress of the deterioration.

Technical problems, configurations, and advantageous effects other than those mentioned above will be apparent with reference to the embodiments below.

DESCRIPTION OF EMBODIMENTS

Hereinafter, embodiments of the present invention will be described with reference to Figures. The embodiments below will be described with examples where the present invention is applied to a battery system that implements an electric power of a plug-in hybrid electric vehicle (PHEV). The configurations of the embodiments below may be applied to cars such as hybrid electric vehicles (HEV) or electric vehicles (EV) and to battery control circuits of battery devices implementing power sources of industrial vehicles such as hybrid train cars.

The embodiments below will be described with examples where lithium ion batteries are employed. However, batteries such as nickel-metal hydride batteries, lead batteries, electric doubled layer capacitors, or hybrid capacitors may be used. In the embodiments below, assembled batteries are implemented by serially connecting cell batteries. However, the assembled battery may be implemented by serially connecting sets of cell batteries that are connected with each other in parallel or by connecting sets of cell batteries in parallel that are connected with each other serially.

Embodiment 1: System Configuration

Figure 1:
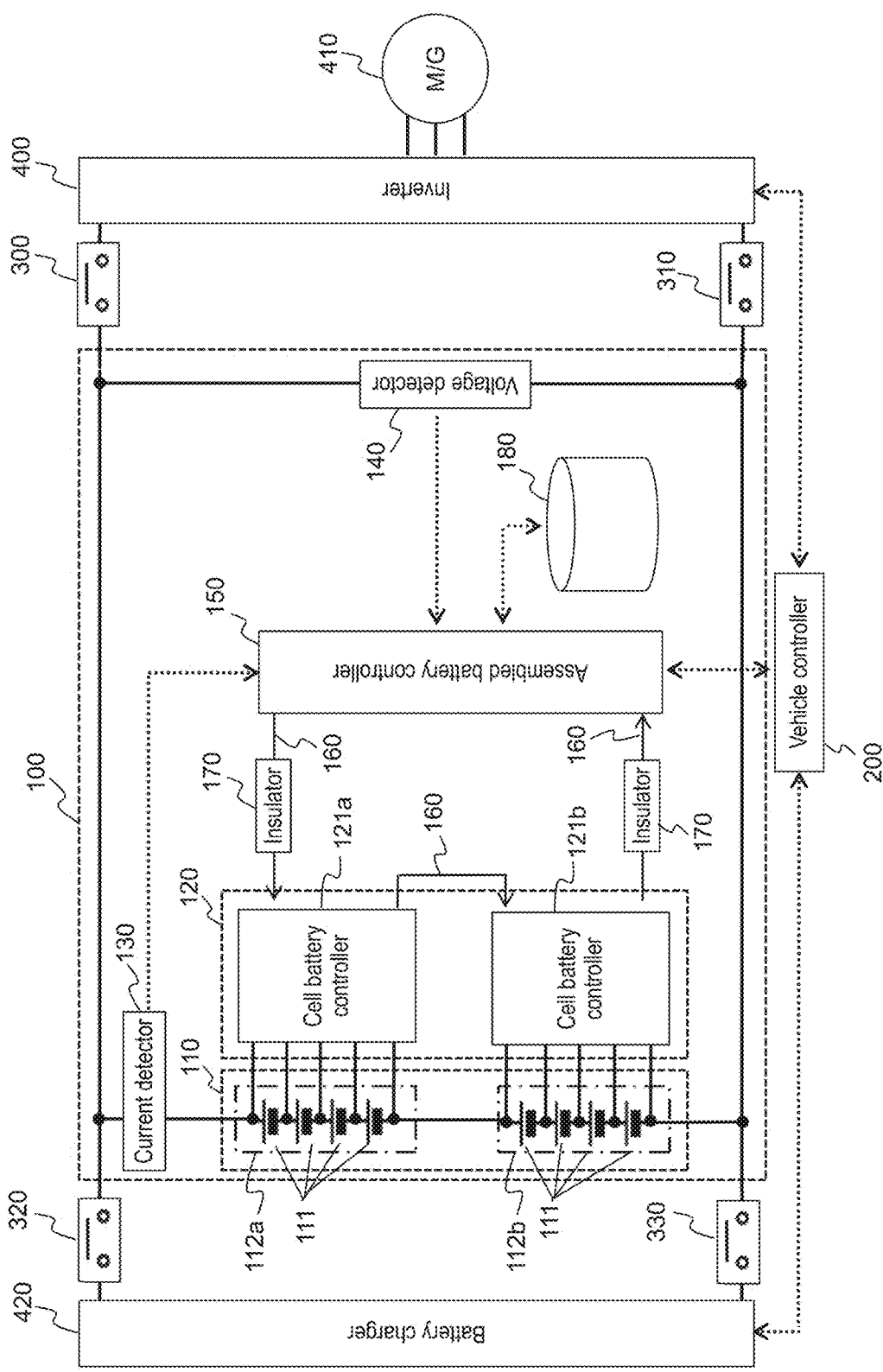
FIG. 1 is a diagram showing a configuration of a battery system 100 according to an embodiment 1 and its peripheral configurations.

FIG. 1 is a diagram showing a configuration of a battery system 100 according to an embodiment 1 of the present invention and its peripheral configurations. The battery system 100 is connected to an inverter 400 through relays 300 and 310. The battery system 100 is connected to a battery charger 420 through relays 320 and 330. The battery system 100 includes an assembled battery 110, a cell battery manager 120, an electric current detector 130, an electric voltage detector 140, an assembled battery controller 150, and a storage unit 180.

The assembled battery 110 is implemented by a plurality of cell batteries 111. The cell battery manager 120 monitors the state of the cell batteries 111. The electric current detector 130 detects the electric current flowing through the battery system 100. The electric voltage detector 140 detects the total voltage of the assembled battery 110. The assembled battery controller 150 detects and manages the state of the assembled battery 110.

The assembled battery controller 150 receives: battery voltages or battery temperatures of the cell battery 111 transmitted by the cell battery manager 120; a value of electric current flowing through the battery system 100 transmitted by the electric current detector 130; and a value of total voltage of the assembled battery 110 transmitted by the electric voltage detector 140. The assembled battery controller 150 detects the state of the assembled battery 110 according to the received information. The result of state detection by the assembled battery controller 150 is sent to the cell batter manager 120 or to the vehicle controller 200.

The assembled battery 110 is implemented by serially connecting a plurality of the cell batteries 111 electrically that are capable of charging and discharging electric energy (charge and discharge of direct current power). The cell batteries 111 implementing the assembled battery 110 are grouped into a predetermined unit number of cell batteries for managing and controlling the states of the cell batteries 111. The grouped cell batteries 111 are serially connected electrically, thereby implementing cell battery groups 112a and 112b. The number of the cell batteries 111 implementing the cell battery group 112 may be the same for all of the cell battery groups 112 or may be different for each of the cell battery groups 112.

The cell battery manager 120 monitors the state of the cell battery 111 implementing the assembled battery 110. The cell battery manager 120 includes a cell battery controller 121 that is provided for each of the cell battery group 112. In FIG. 1, the cell battery controllers 121a and 121b are provided that correspond to the cell battery groups 112a and 112b. The cell battery controller 121 monitors and controls the state of the cell battery 111 implementing the cell battery group 112.

In the embodiment 1, for the sake of simplicity of description, four units of the cell batteries 111 are serially connected electrically to implement the cell battery groups 112a and 112b, and the cell battery groups 112a and 112b are further serially connected electrically, thereby implementing the assembled battery 110 including eight units of the cell batteries 111.

The assembled battery controller 150 and the cell battery manager 120 send and receive signals through signal communication means 160 and an insulating element 170 such as photo coupler. The insulating element 170 is provided because the operational voltage of the assembled battery controller 150 is different from that of the cell battery manager 120. In other words, the cell battery manager 120 operates with electric power received from the assembled battery 110, and on the other hand the assembled battery controller 150 uses a battery for car equipment (e.g. 14V batteries) as a power source. The insulating element 170 may be implemented on the circuit board implementing the cell battery controller 120 or may be implemented on the circuit board implementing the assembled battery controller 150. The insulating element 170 may be omitted depending on the system configuration.

Hereinafter, the communication means will be described which is provided between the assembled battery controller 150 and the cell battery controllers 121a and 121b implementing the cell battery manager 120. The cell battery controllers 121a and 121b are serially connected in descending order of electric potential of the cell battery groups 112a and 112b monitored by the cell battery controllers 121a and 121b respectively. The signal sent from the assembled battery controller 150 to the cell battery manager 120 is inputted into the cell battery controller 121a through the insulating element 170a and through the signal communication means 160. The output from the cell battery controller 121*a* is inputted into the cell battery controller 121*b* through the signal communication means 160. The output of the cell battery controller 121*b* at the lowest order is transmitted to the assembled battery controller 150 through the insulating element 170 and through the signal communication means 160. In the embodiment 1, the insulating element 170 is not provided between the cell battery controllers 121*a* and 121*b*. However, the cell battery controllers 121*a* and 121*b* may send and receive signals between each other through the insulating element 170.

The storage unit 180 stores information of the assembled battery 150, of the cell battery 111, and of the cell battery group 112, such as internal resistances characteristics, capacitances in fully charged state, polarization voltages, deterioration characteristics, individual difference information, or relationships between SOC and OCV. In the embodiment 1, the storage unit 180 is provided at outside of the assembled battery controller 150 or of the cell battery manager 120. However, the assembled battery controller 150 or the cell battery manager 120 may include the storage unit and the information above may be stored in the storage unit.

Using the information sent by the assembled battery controller 150, the vehicle controller 200 controls the inverter 400 connected with the battery system 100 through the relays 300 and 310. The vehicle controller 200 further controls the battery charger 420 connected with the battery system 100 through the relays 320 and 330. While the vehicle is running, the battery system 100 is connected with the inverter 400 and uses the energy stored in the assembled battery 110 to drive the motor generator 410. While the vehicle is charged, the battery system 100 is connected with the battery charger 420 and is charged by electric power supply from electric power sources for home use or from electric power stations.

The battery charger 420 is used when charging the assembled battery 110 using external power sources such as those at home or at power charge station. In the embodiment 1, the battery charger 420 controls the charging voltage or the charging current according to instructions from the vehicle controller 200. However, the battery charger 420 may control them according to instructions from the assembled battery controller 150. The battery charger 420 may be installed within the vehicle or may be installed at outside of the vehicle depending on the configuration of the vehicle, on the performance of the battery charger 420, on the purpose of the battery charger 420, or on the install condition of the external power sources.

Under the control of the vehicle controller 200, the battery system 100 is connected to the inverter 400 and drives the motor generator 410 using the energy stored in the assembled battery 110 when the vehicle system equipping the battery system 100 runs, and the assembled battery 110 is charged by the generated power of the motor generator 410 in regeneration. When the vehicle equipping the battery system 100 is connected with external power sources such as those at home or at power stations, the battery system 100 is connected with the battery charger 420 according to the information sent from the vehicle controller 200, and the assembled battery 110 is charged up to a predetermined condition. The energy stored by the charge operation into the assembled battery 110 is utilized in the next run of the vehicle or in driving electric equipment within or outside of the vehicle. If necessary, the energy may be further extracted to external power sources such as home power sources.

Figure 2:
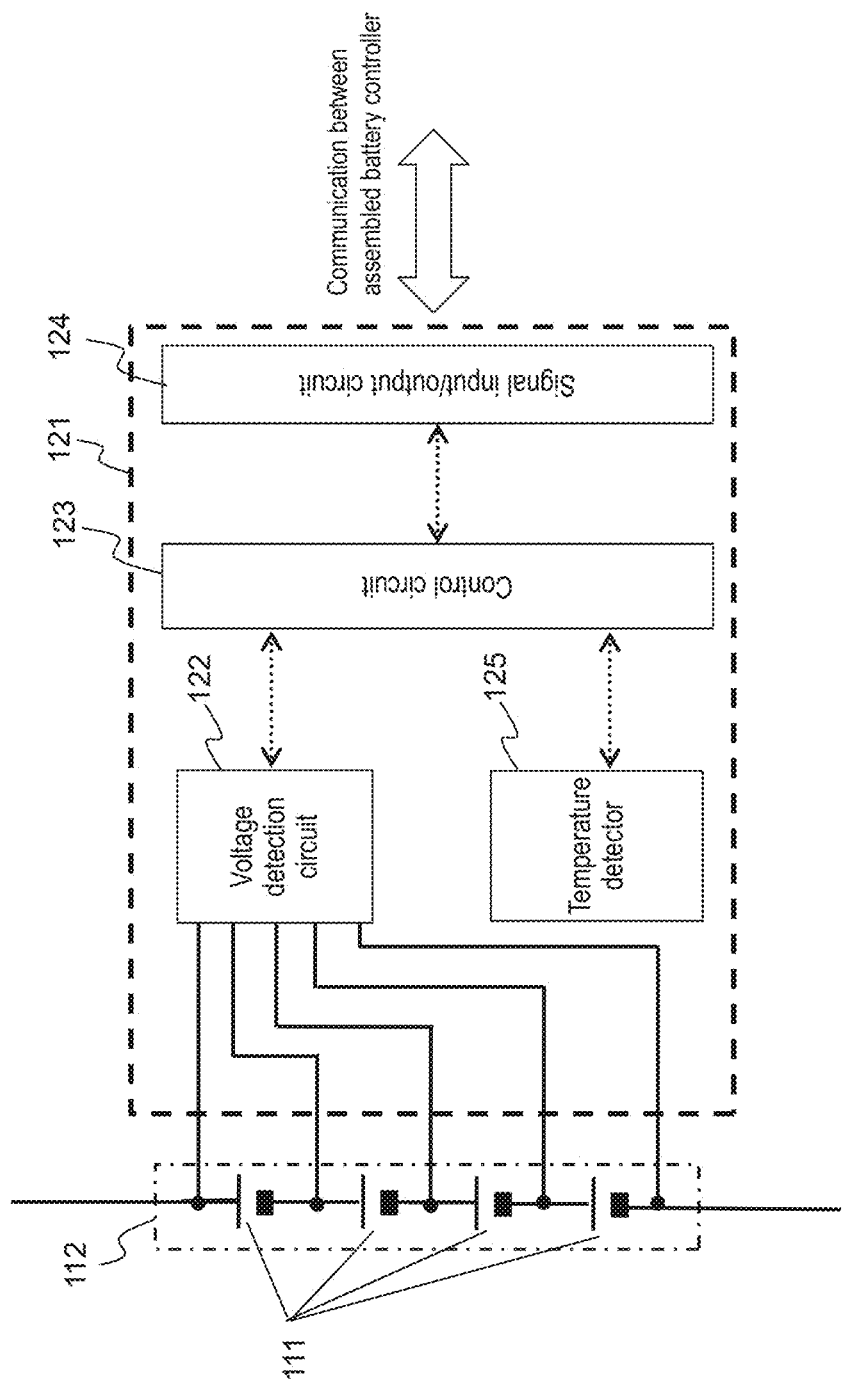
FIG. 2 is a diagram showing a circuit configuration of a cell battery controller 121.

FIG. 2 is a diagram showing a circuit configuration of the cell battery controller 121. The cell battery controller 121 includes a voltage detection circuit 122, a control circuit 123, a signal input/output circuit 124, and a temperature detector 125. The voltage detection circuit 122 measures a voltage between both ends of each of the cell batteries 111. The control circuit 123 receives measured results from the voltage detection circuit 122 and from the temperature detector 125, and transmits the received results to the assembled battery controller 150 through the signal input/output circuit 124. A circuit configuration for equalizing variations of voltages or SOCs between the cell batteries 111 that may occur due to self discharge or due to variations in consumption currents is typically implemented in the cell battery controller 121. However, such circuit configurations may be commonly known and thus are omitted in the figure.

The temperature detector 125 included in the cell battery controller 121 in FIG. 2 has a functionality for measuring the temperature of the cell battery group 112. The temperature detector 125 measures one temperature of the cell battery group 112 as a whole and handles the measured temperature as a representative temperature of the cell batteries 111 implementing the cell battery group 112. The temperature measured by the temperature detector 125 is used in various calculations for detecting states of the cell battery 111, of the cell battery group 112, or of the assembled battery 110. Since FIG. 2 assumes such configurations, one unit of the temperature detector 125 is provided in the cell battery controller 121. It is possible to provide the temperature detector 125 for each of the cell batteries 111 to measure the temperature of each of the cell batteries. However, since the number of the temperature detector 125 is increased in that case, the configuration of the cell battery controller 121 is complicated.

In FIG. 2, the temperature detector 125 is shown in a simplified manner. However, in actual configurations: a temperature sensor is provided for the temperature measurement target; the provided temperature sensor outputs temperature information as a voltage; the voltage is measured and is transmitted to the signal input/output circuit 124 through the control circuit 123; and the signal input/output circuit 124 outputs the measured result to outside of the cell battery controller 121. A functionality performing this process flow may be implemented as the temperature detector 125 in the cell battery controller 121, and the measurement of the temperature information (voltage) may be performed by the voltage detection circuit 122.

Figure 3:
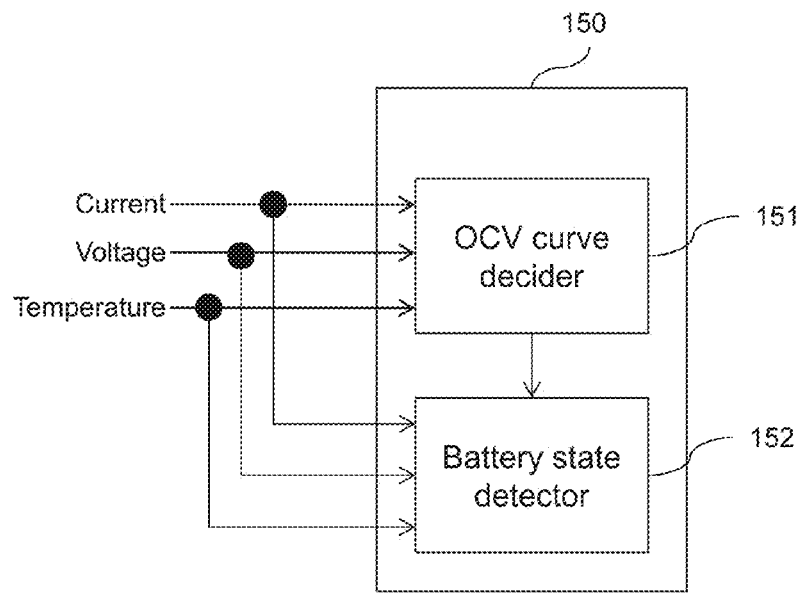
FIG. 3 is a configuration diagram of an assembled battery controller 150.

FIG. 3 is a configuration diagram of the assembled battery controller 150. The assembled battery controller 150 includes an OCV curve decider 151 and a battery state detector 152. The assembled battery controller 150 receives: measured values of battery voltage and temperature of the cell battery 111 outputted by the cell battery manager 120; battery current values outputted by the electric current detector 130; total voltage values of the assembled battery 110 outputted by the electric voltage detector 140; and control signals outputted by the vehicle controller 200.

The battery state detector 152 calculates SOC or SOH of the cell battery 111 according to each inputted information, to the internal resistance of the cell battery 111 stored in the storage unit 180, and to the relationship between SOC and OCV described with reference to FIG. 4 later. The calculated results and instructions based on the calculated results are outputted to the cell battery manager 120 or to the vehicle controller 200. The configuration of the OCV curve decider 151 will be described with reference to FIG. 6 later.

Figure 4:
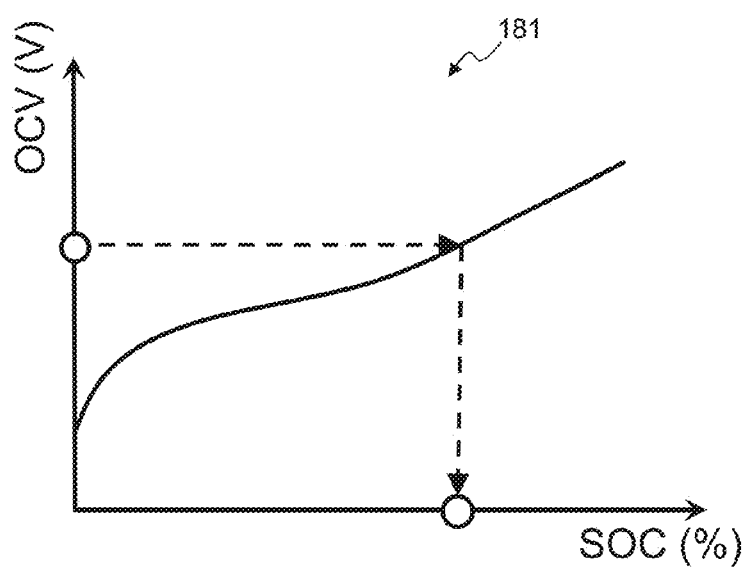
FIG. 4 is a diagram showing an example of a relationship between SOC and OCV of a battery stored in a storage unit 180.

FIG. 4 is a diagram showing an example of relationship between SOC and OCV stored in the storage unit 180. The battery state detector 152, for example: calculates OCV by subtracting IR drop and Vp from closed circuit voltage CCV; and calculates SOC from the calculated OCV according to the relationship between SOC and OCV shown in FIG. 4. However, this SOC varies depending on the state of health of the cell battery 111. Thus it is necessary to recalculate it depending on the state of health using the method described later.

Figure 5:
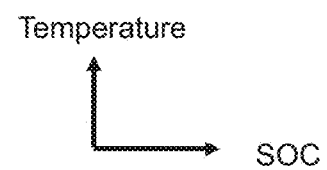
FIG. 5 is a diagram showing a configuration example of a SOC table 181.

A SOC table 181 is data describing the relationship between OCV of the cell battery 111 and SOC of the cell battery 111 in formats such as tables or functions. FIG. 5 is a diagram showing a configuration example of the SOC table 181. The SOC table 181 is configured as a data table that describes the relationship between OCV of the cell battery 111 and SOC of the cell battery 111 with respect to the temperature of the cell battery 111.

Figure 6:
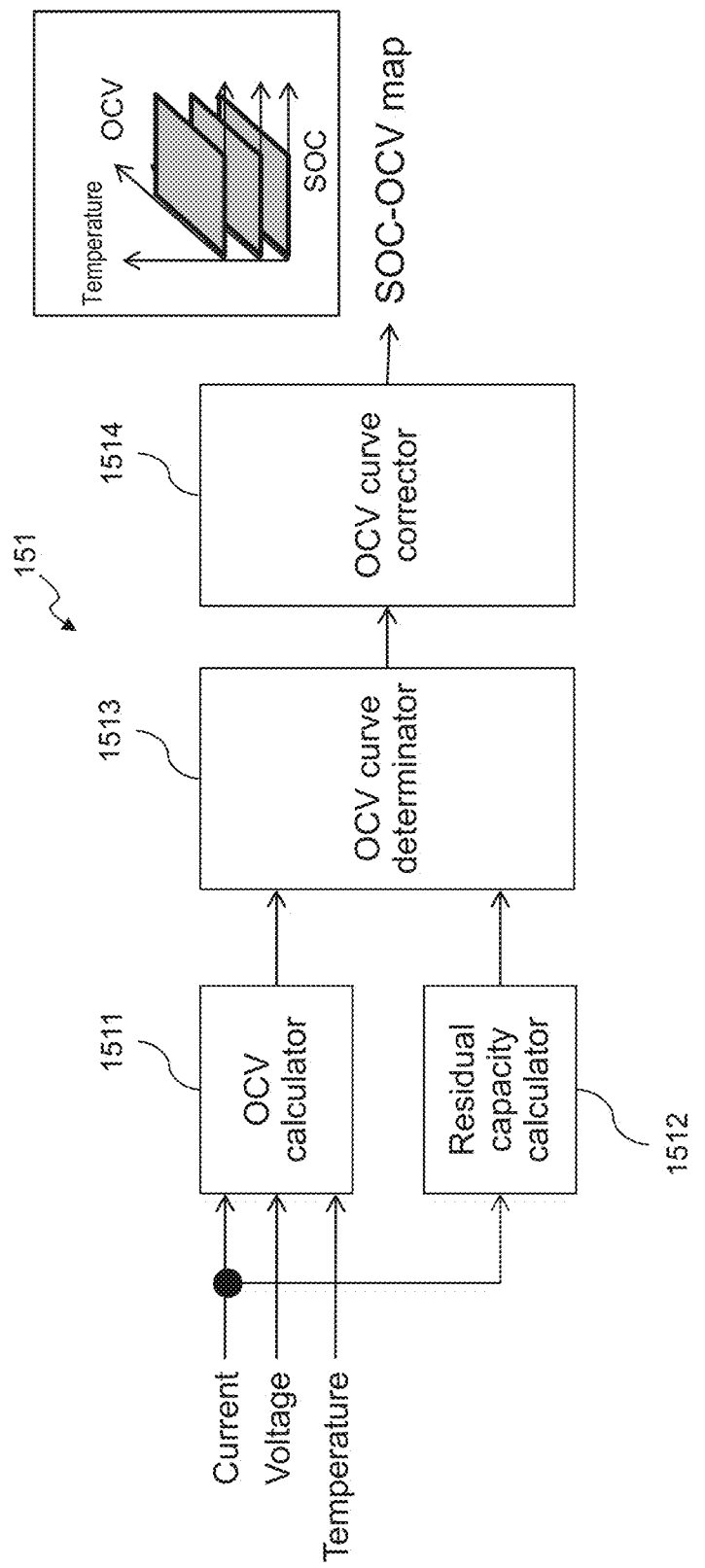
FIG. 6 is a configuration diagram of an OCV curve decider 151.

FIG. 6 is a configuration diagram of the OCV curve decider 151. The OCV curve decider 151 includes an OCV calculator 1511, a residual capacity calculator 1512, an OCV curve determinator 1513, and an OCV curve corrector 1514.

The OCV calculator 1511 calculates OCV of the cell battery 111 using electric current, electric voltage, and temperature of the cell battery 111 as inputs. The residual capacity calculator 1512 calculates residual capacities of the cell battery 111 by integrating the battery current detected by the electric current detector 130. The OCV curve determinator 1513 determines whether characteristics of a SOC-OCV curve described in FIG. 9 later is varied using OCV and the residual capacity as inputs. When the OCV curve determinator 1513 detects that the characteristics of the SOC-OCV curve are varied, the OCV curve corrector 1514 selects and outputs the SOC-OCV curve corresponding to the varied characteristics. The SOC-OCV curve may be described as map data describing the relationship between SOC and OCV for each of temperatures.

Figure 7:
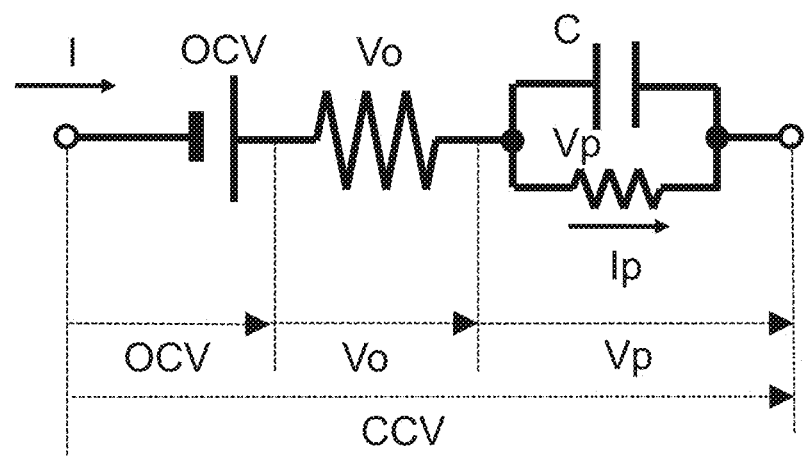
FIG. 7 is a diagram showing a sequence for an OCV calculator 1511 to calculate OCV.

FIG. 7 is a diagram showing a sequence for the OCV calculator 1511 to calculate OCV. The cell battery 111 may be described as an equivalent circuit as shown in FIG. 7. Namely, the cell battery 111 may be described as a circuit in which a direct current power source simulating the open circuit voltage of the battery, Ro representing the electric resistance of the electrode or of the electrolyte solution, and a parallel circuit of Rp and C representing the loss due to electrochemical reactions of the battery are connected in series. The voltage detected by the electric voltage detector 140 or by the voltage detection circuit 122 corresponds to CCV (closed circuit voltage) in FIG. 7. OCV when current I flows through the equivalent circuit of FIG. 7 may be described as Equation 1 below.

[Formula 1]

$$OCV(t)=CCV(t)-Vo(t)-Vp(t)$$

$$Vo(t)=I(t) \times Ro \times SOHR/100$$

$$Vp(t)=Ip(t) \times Rp \times SOHR/100 \quad \text{Equation 1}$$

Ro and Rp may be determined according to data tables stored in the storage unit 180 in advance. SOHR is a SOH calculated in accordance with internal resistance of battery. SOHR represents an increase ratio of internal resistance of battery that increases along with deterioration of the battery. SOHR is defined as Equation 2 below. The OCV calculator 1511 calculates OCV using Equation 1 above. If the current I is 0 in Equation 1, the second term of the right side is 0 and the third term of the right side also becomes 0 after a certain amount of time has passed from the termination of energization. In other words, the voltage when the current I is 0 and after a certain amount of time has passed from the termination of energization, which is detected by the electric voltage detector 140 or by the voltage detection circuit 122, may be deemed as OCV. Thus it is preferable to acquire OCV.

[Formula 2]

$$SOHR=100 \times R1(SOC,T)/R0(SOC,T) \quad \text{Equation 2}$$

R1(SOC, T) represents an internal resistance [Ω] of the cell battery 111 at current time (after deterioration). R0(SOC, T) represents an internal resistance [Ω] of the non-deteriorated cell battery 111. R1(SOC, T) may be calculated according to a proportion of a current variation (ΔI=I2−I1) to a voltage variation (ΔV=V2−V1) during charging/discharging periods, as shown in Equation 3 below.

[Formula 3]

$$R1=\Delta V/\Delta I \quad \text{Equation 3}$$

The value of R0 may be previously stored in the storage unit 180 as a data table that is described with respect to SOC and temperature of the cell battery 111. Values of R0 corresponding to SOC and temperature during charging/discharging periods may be acquired using Equation 4 below. SOHR of the cell battery 111 may be acquired by applying R1 and R0 acquired from Equations 3 and 4 into Equation 2.

[Formula 4]

$$R0=R\text{Map}(SOC(t),T(t)) \quad \text{Equation 4}$$

The residual capacity calculator 1512 calculates, by integrating electric current values acquired by the electric current detector 130 during charging/discharging periods, residual capacities stored in the assembled battery 110 or in each of the cell batteries 111 implementing the assembled battery 110.

Figure 8:
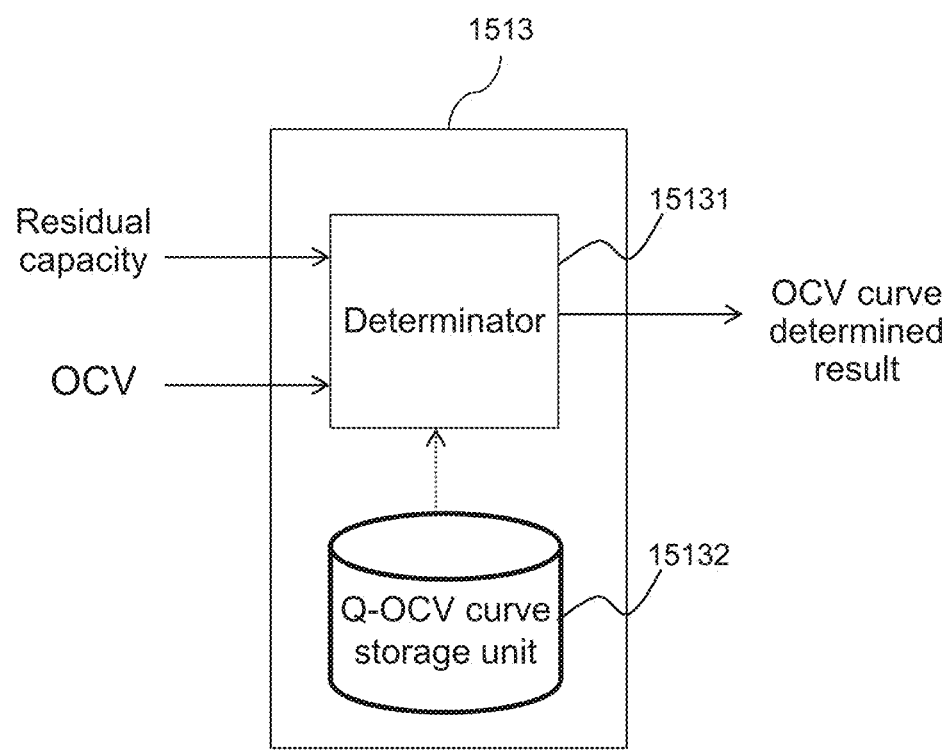
FIG. 8 is a configuration diagram of an OCV curve determinator 1513.

FIG. 8 is a configuration diagram of the OCV curve determinator 1513. The OCV curve determinator 1513 includes a determinator 15131 and a Q-OCV curve storage unit 15132. The determinator 15131 determines whether the relationship between SOC and OCV has changed, using: the residual capacity calculated by the residual capacity calculator 1512; OCV calculated by the OCV calculator 1511; and Q-OCV curve describing the relationship between residual capacity and OCV stored in the Q-OCV curve storage unit 15132.

Figure 9:
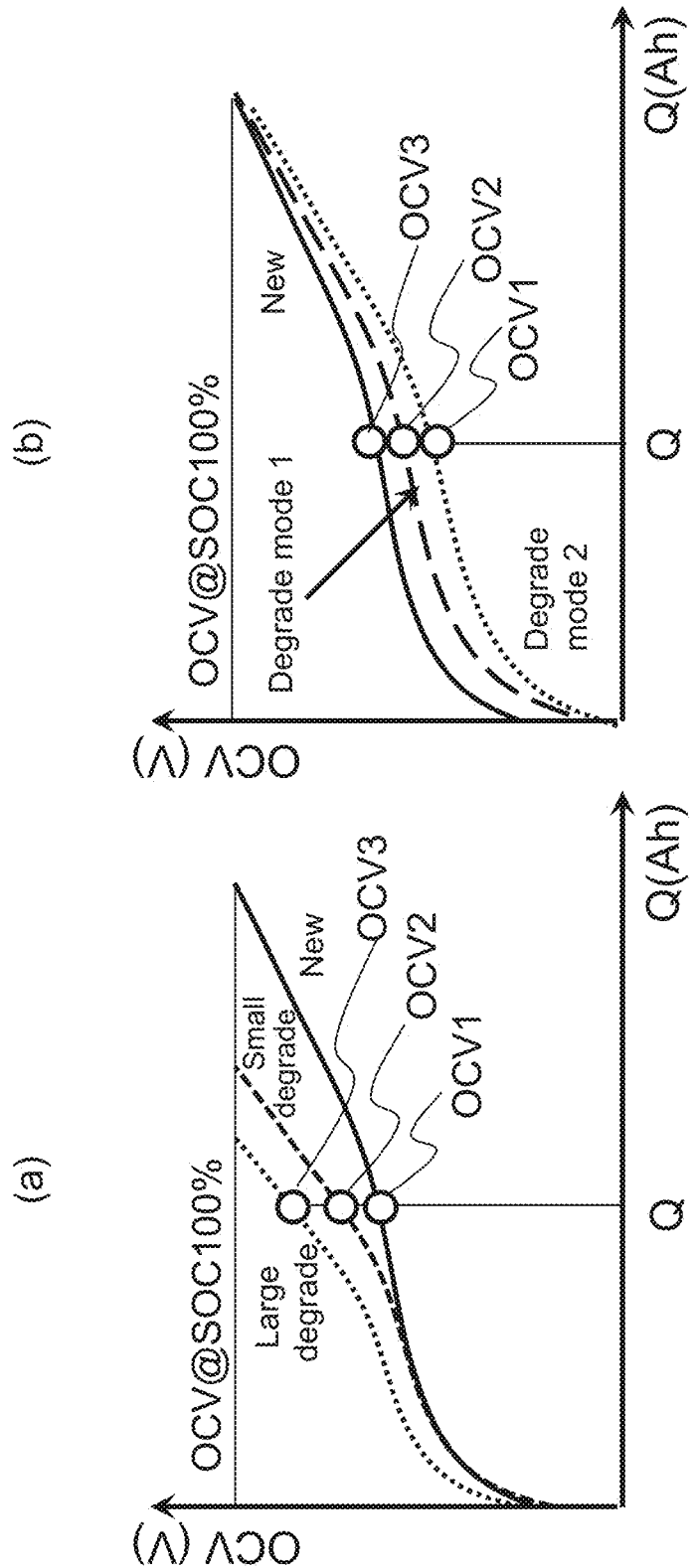
FIG. 9 is a diagram showing an example of Q-OCV curve describing a relationship between a residual capacity and OCV stored in a Q-OCV curve storage unit 15132.

FIG. 9 is a diagram showing an example of Q-OCV curve describing a relationship between residual capacity and OCV stored in the Q-OCV curve storage unit 15132. The horizontal axis of FIG. 9 represents residual capacity Q (Ah). The vertical axis of FIG. 9 represents OCV (V).

As deterioration of battery proceeds, not only SOC-OCV curve varies but also the maximum charge capacity varies. Therefore, the relationship between residual capacity and OCV changes as the deterioration proceeds as shown in FIG. 9(a). The value of OCV corresponding to the same residual capacity is different for each of the degree of deterioration. Thus the relationship between residual capacity and OCV depending on state of health is measured in advance, and the relationship is stored in the Q-OCV curve storage unit 15132.

FIG. 9(b) shows another example in which Q-OCV curve varies as the battery deterioration proceeds. As shown by the value at the fully charged state in FIG. 9(b), even if the maximum charge capacity is the same, Q-OCV curve may exhibit different characteristics. Therefore, it cannot be determined that the relationship between SOC and OCV is not varied only because the maximum charge capacity is not decreased.

Figure 10:
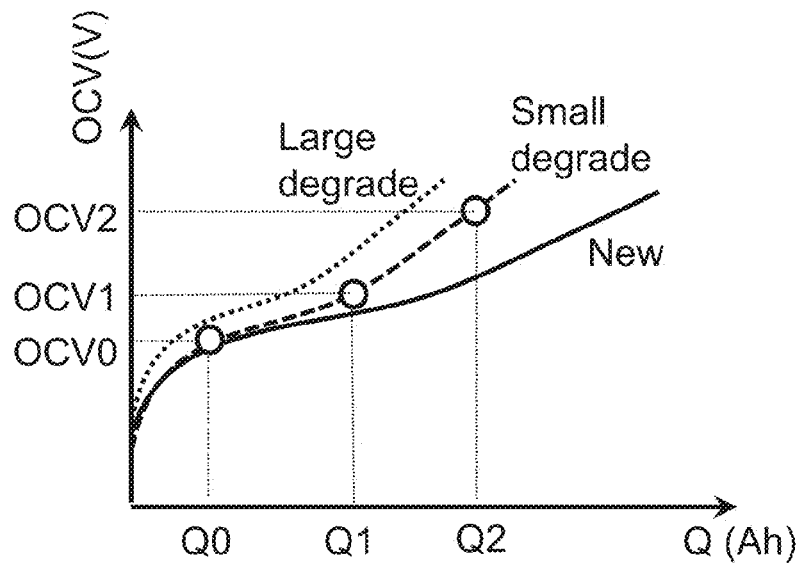
FIG. 10 is a diagram showing a sequence for a determinator 15131 to identify a Q-OCV curve.

FIG. 10 is a diagram showing a sequence for the determinator 15131 to identify a Q-OCV curve. The OCV curve determinator 15131: acquires a plurality of combinations of residual capacity and OCV; and determines which one of Q-OCV curves stored in the Q-OCV curve 15132 matches with the acquired residual capacity and OCV. The determined result is outputted to the OCV curve corrector 1514 in the form of such as Q-OCV curve IDs stored in the Q-OCV curve storage unit 15132.

Figure 11:
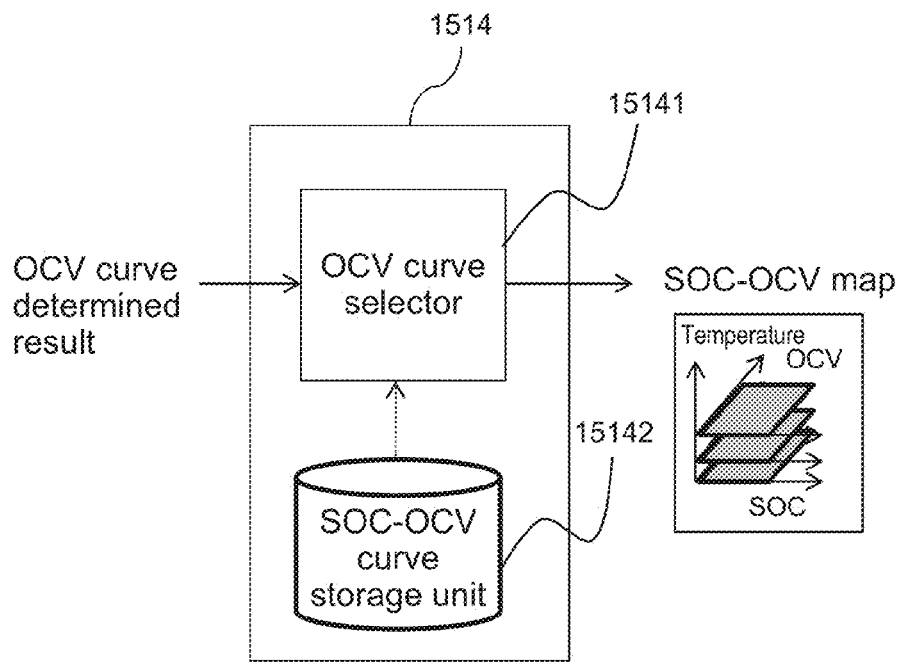
FIG. 11 is a configuration diagram of an OCV curve corrector 1514.

FIG. 11 is a configuration diagram of the OCV curve corrector 1514. The OCV curve corrector 1514 includes an OCV curve selector 15141 and a SOC-OCV curve storage unit 15142. The OCV curve selector 15141 receives the determined result by the OCV curve determinator 1513, then selects a SOC-OCV curve corresponding to the determined result from the SOC-OCV curve storage unit 15142 and outputs it.

Figure 12:
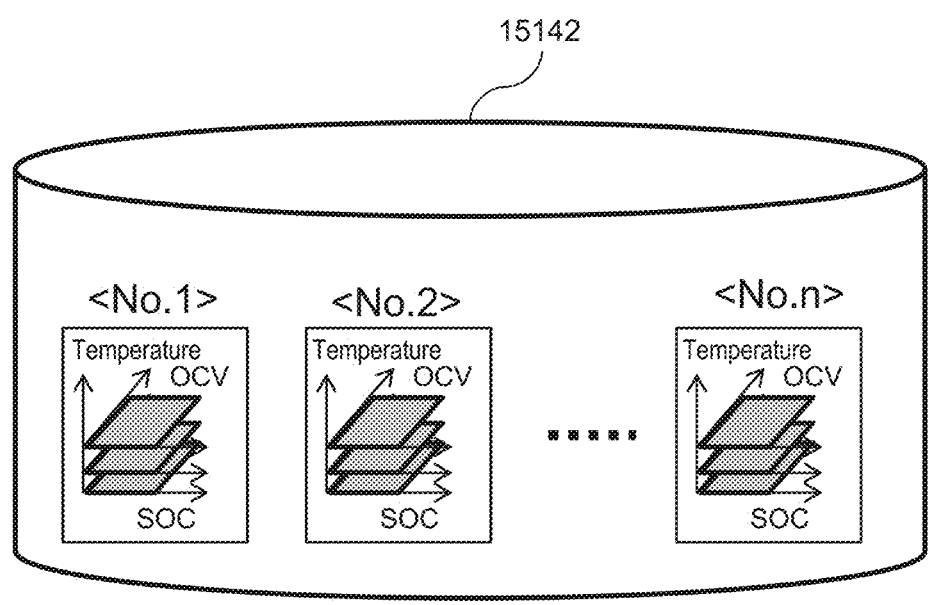
FIG. 12 is a diagram showing an example of SOC-OCV curve stored in a SOC-OCV curve storage unit 15142.

FIG. 12 is a diagram showing an example of SOC-OCV curve stored in the SOC-OCV curve storage unit 15142. The SOC-OCV curve storage unit 15142 stores a plurality of SOC-OCV curves corresponding to various patterns of Q-OCV curves shown in FIG. 9. Each of SOC-OCV curves may be described as map data describing the relationship between SOC and OCV for each of temperatures. The OCV curve selector 15141 selects a SOC-OCV curve corresponding to the determined result of Q-OCV curve (e.g. Q-OCV curve ID) outputted from the determinator 15131. The correspondence between the determined result and SOC-OCV curve may be previously determined.

Figure 13:
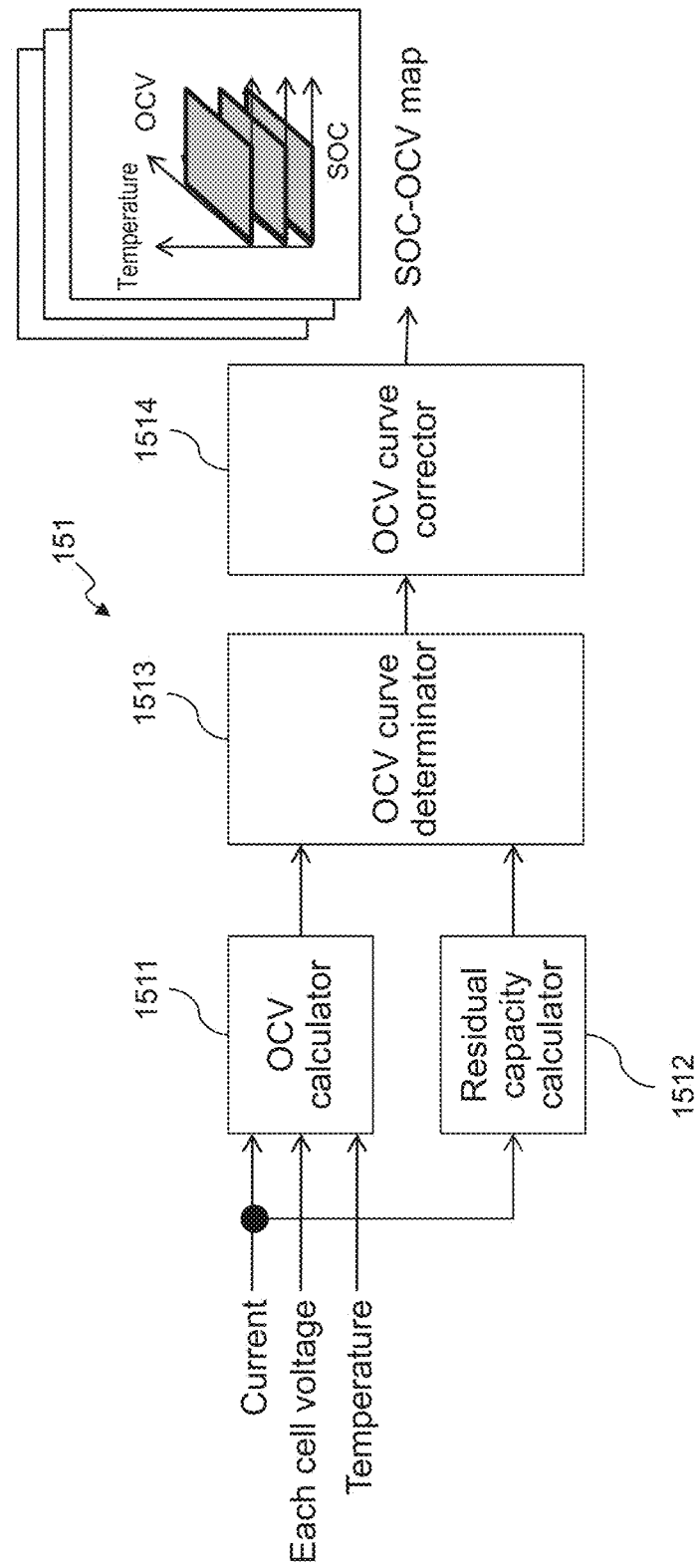
FIG. 13 is a diagram showing another configuration example of the OCV curve decider 151.

FIG. 13 is a diagram showing another configuration example of the OCV curve decider 151. Individual variations or variations in deterioration characteristics may occur in the cell batteries 111 implementing the assembled battery 110. Thus as shown in FIG. 13, by inputting into the OCV curve decider 151 each of voltages of the cell batteries 111 acquired by the cell battery manager 120, it is possible to determine the relationship between SOC and OCV for each of the cell batteries 111. In this case, it is preferable if the Q-OCV curve storage unit 15132 and the SOC-OCV curve storage unit 15142 store each data in association with information about individual variations.

When using battery voltages of each of the assembled batteries 110 as the measured value without considering characteristics of each of the cell batteries 111, a sum of both-end voltages of each of the cell batteries 111 may be used as a both-end voltage of the assembled battery 110.

Embodiment 1: System Operation

Figure 14:
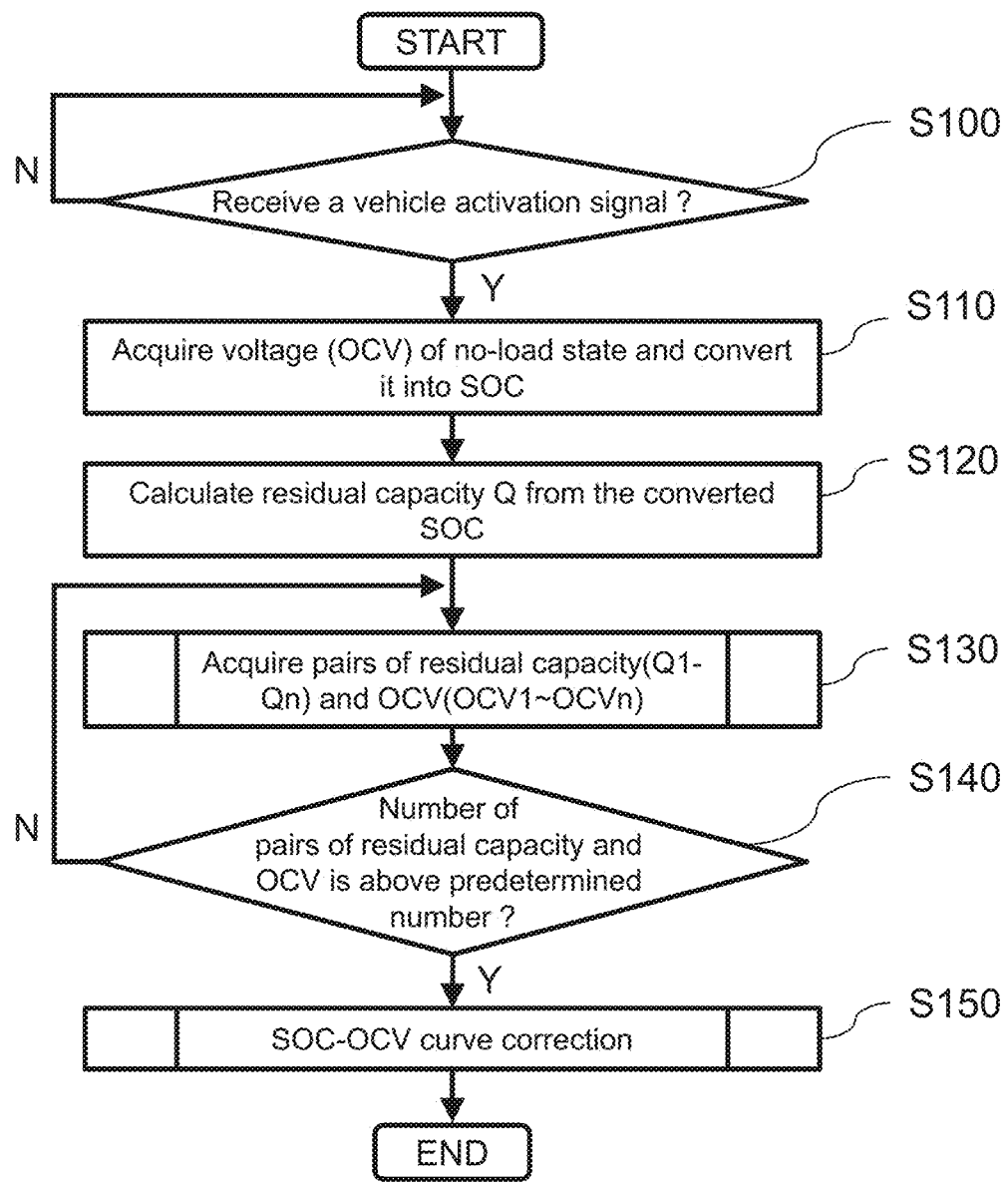
FIG. 14 is a flowchart showing an overall operation of the battery control system 100.

FIG. 14 is a flowchart showing an overall operation of the battery control system 100. Hereinafter, each step in FIG. 14 will be described.
(FIG. 14: Step S100)
The assembled battery controller 150 determines whether it receives a signal indicating that the vehicle has been activated. If the signal is received, the process proceeds to step S110. If not received, the assembled battery controller 150 waits for the signal.
(FIG. 14: Step S110)
The assembled battery controller 150 acquires a battery voltage of no-load state in which the assembled battery 110 is not connected with the load (i.e. OCV), and converts the acquired OCV into SOC using the SOC table 181. It is noted that the SOC calculated in this step is provisional which may be corrected in following steps.
(FIG. 14: Step S120)
The residual capacity calculator 1512 calculates a residual capacity Q according to Equation 5 using the SOC acquired in step S110 and using a maximum capacity of the battery Qmax (Ah).

[Formula 5]

$$Q = Q_{max} \times SOC/100 \qquad \text{Equation 5}$$

(FIG. 14: Step S130)
The determinator 15131 acquires a plurality of pairs of residual capacity Q and OCV in order to determine whether the characteristics of Q-OCV curve have changed. Details of this step will be described later with reference to FIG. 15.
(FIG. 14: Step S140)
The determinator 15131 determines whether the number of pairs of residual capacity Q and OCV acquired in step S130 has reached a predetermined number. If the number is at or above the predetermined number, the process proceeds to step S150. If not, the process repeats step S130.
(FIG. 14: Step S150)
The determinator 15131 determines, according to the pair of residual capacity Q and OCV acquired in step S130, whether the characteristics of Q-OCV curve have changed. If the characteristic have changed, the determinator 15131 selects a SOC-OCV curve corresponding to the Q-OCV curve after the change. Details of this step will be described later with reference to FIG. 16.

Figure 15:
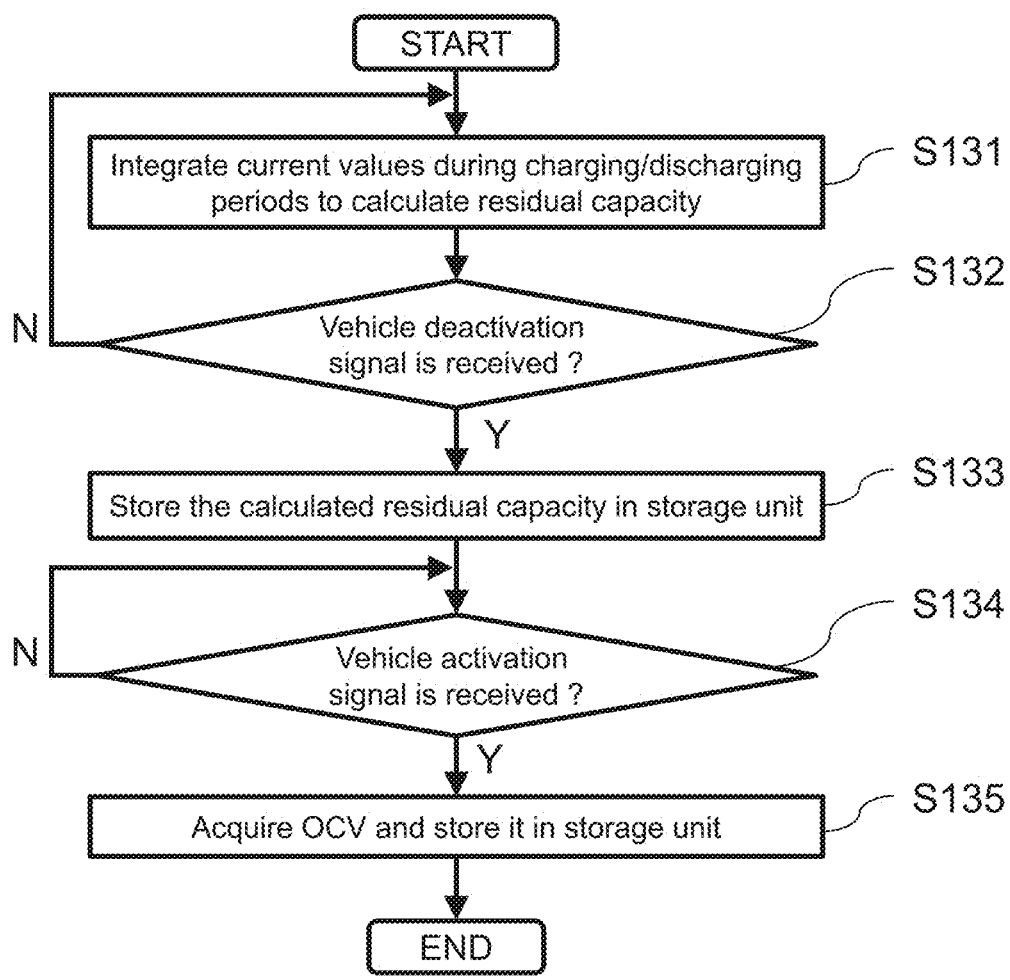
FIG. 15 is a flowchart showing details of step S130.

FIG. 15 is a flowchart showing details of step S130. Hereinafter, each step in FIG. 15 will be described.
(FIG. 15: Step S131)
The residual capacity calculator 1512 calculates residual capacities (Q1–Qn) of the battery at a plurality of time points by integrating battery current values during charging/discharging periods and by adding the integrated result into the residual capacity Q calculated in step S120.
(FIG. 15: Steps S132-S133)
The residual capacity calculator 1512 determines whether it received a vehicle deactivation signal (S132). If the signal is received, the residual capacity calculator 1512 stores the residual capacity calculated in step S131 into the storage unit 180. If not received, the residual capacity calculator 1512 returns back to step S131.
(FIG. 15: Steps S132-S133: Additional Note)
In order to acquire OCV which is acquired in conjunction with the residual capacity when the vehicle is activated next time, the residual capacity is stored in the storage unit 180 when the vehicle has stopped. This is because: while the vehicle is running, the calculated result of OCV may include errors due to current sensor errors when calculating OCV from battery voltages (CCV) or due to modeling errors of the polarization voltage (Vp) in FIG. 7. The OCV may be precisely acquired in a stable condition when the vehicle has activated. Thus the embodiment 1 detects changes in the relationship between SOC and OCV using a pair of the residual capacity recorded at the time of vehicle deactivation and the stable OCV acquired at the time of next activation. Specific operational images will be described later with reference to FIG. 17.
(FIG. 15: Steps S134-S135)
The OCV calculator 1511 determines whether a vehicle activation signal is received (S134). If the signal is received, the OCV calculator 1511 acquires a voltage of no-load state (i.e. OCV) and stores it in the storage unit 180 (S135). If not received, the process returns to step S134. When the OCV is stored into the storage unit 180, the OCV is associated with the residual capacity stored in the storage unit 180 in step S133. Specific images of the pair will be described later with reference to FIG. 17.

Figure 16:
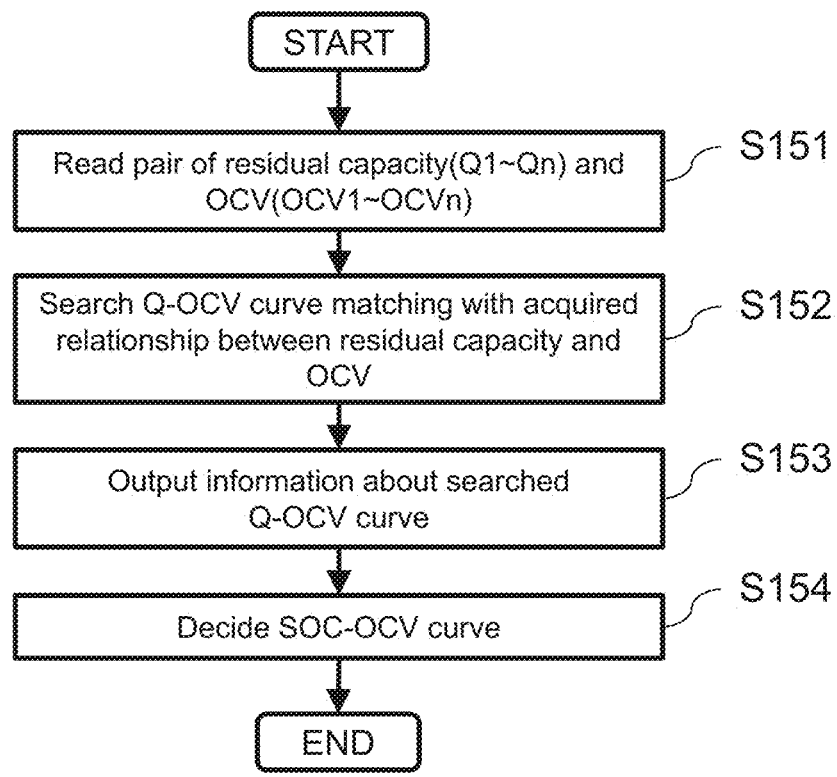
FIG. 16 is a flowchart showing details of step S150.

FIG. 16 is a flowchart showing details of step S150. Hereinafter, each step in FIG. 16 will be described.

(FIG. 16: Step S151-S152)

The determinator 15131 reads out the pair of residual capacity Q and OCV stored in step S130 (S151). The determinator 15131 searches a Q-OCV curve stored in the Q-OCV curve storage unit 15132 that matches with the pair of residual capacity Q and OCV acquired in step S151 (S152).

(FIG. 16: Step S153)

The determinator 15131 outputs, into the OCV curve corrector 1514, a determined result about Q-OCV curve in step S152. This determined result may be such as: a Q-OCV curve ID identified in step S152; or information about conditions in which the Q-OCV curve is measured (e.g. SOC, temperature, and used condition of battery). Namely, any information may be employed as long as a SOC-OCV curve corresponding to the Q-OCV curve is identified.

(FIG. 16: Step S154)

The OCV-curve 1514 selects, from the SOC-OCV curve storage unit 15142, a SOC-OCV curve corresponding to the Q-OCV curve identified in step S153. The OCV curve corrector 1514 replaces the selected SOC-OCV curve with the one before correction.

Figure 17:
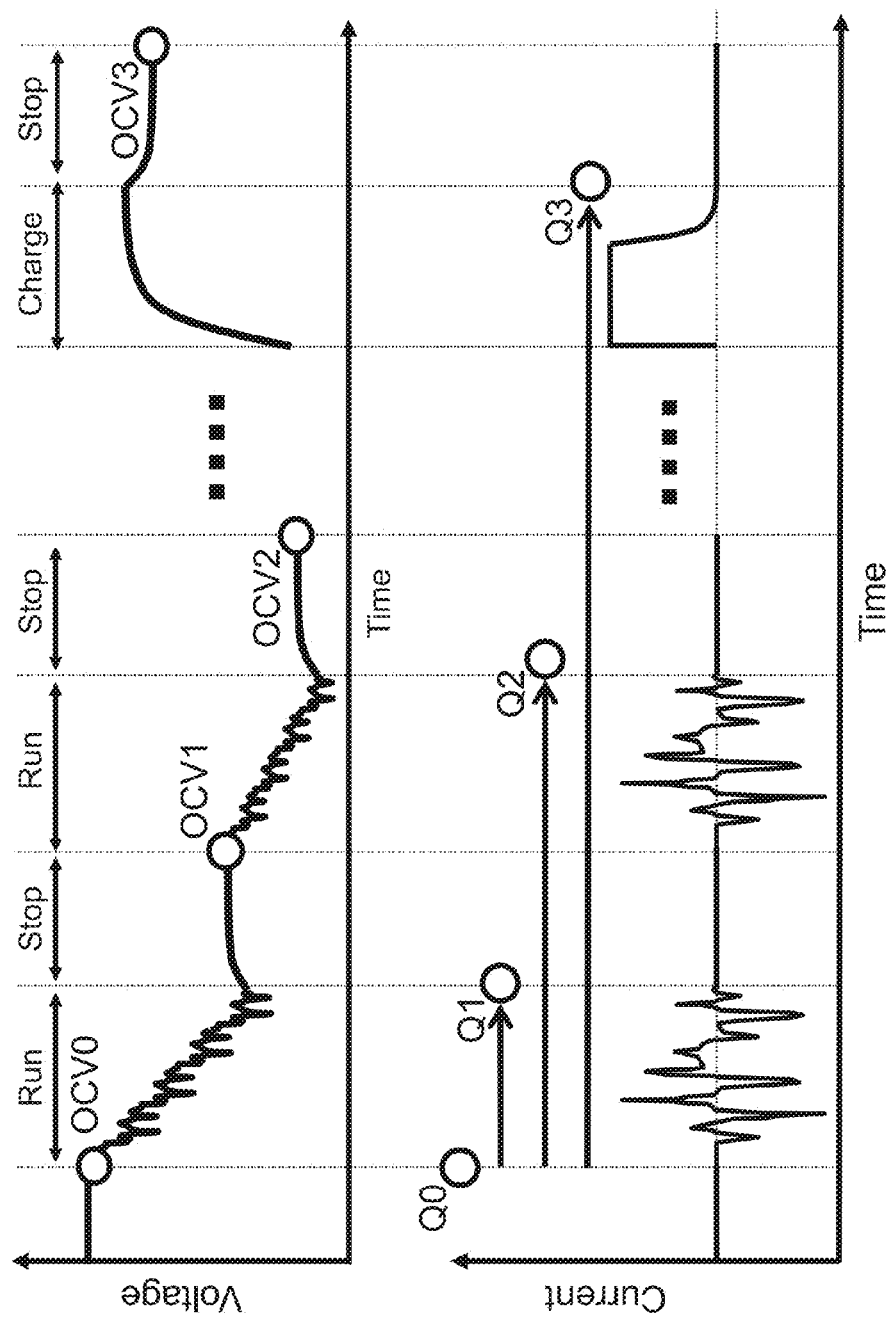
FIG. 17 is a diagram showing an operational image for the OCV curve decider 151 to acquire a pair of residual capacity Q and OCV in step S130.

FIG. 17 is a diagram showing an operational image for the OCV curve decider 151 to acquire a pair of residual capacity Q and OCV in step S130. FIG. 17 shows an operational pattern in which the vehicle repeats run and stop and then charges up to the maximum capacity using the battery charger 420.

The OCV curve decider 151 acquires a residual capacity Q when the vehicle stops or when charge is completed, and acquires an OCV at the time when a predetermined time has passed from the car stop or from the charge is completed. Since the deterioration of battery proceeds as time progresses, it is preferable to acquire the pair of residual capacity Q and OCV for using in acquiring the relationship between SOC and OCV in a certain amount of period, e.g. in one-month.

In the example of FIG. 17, OCV is acquired at the time after the vehicle is activated in which the battery voltage is stable so that OSV may be precisely detected. However, the relationship between residual capacity Q and OCV may be acquired by calculating OCV during energization according to Equation 1.

Embodiment 1: Summary

As discussed thus far, the battery control device according to the embodiment 1: detects changes in the relationship between residual capacity Q and OCV (Q-OCV curve); and uses a SOC-OCV curve corresponding to a Q-OCV curve after the change. Accordingly, it is possible to precisely detect SOC even if the battery characteristics change due to battery deterioration. In addition, it is also possible to precisely calculate battery parameters such as SOH using SOC. Thus it is possible to provide a battery control system with high reliability.

Embodiment 2

The embodiment 1 detects changes in the relationship between residual capacity Q and OCV (Q-OCV curve), thereby detecting changes in SOC-OCV curve due to deterioration of battery. Internal resistance of battery may be used as another battery parameter that may change due to battery deterioration. Thus in an embodiment 2 of the present invention, a configurational example will be described in which changes in internal resistance of battery are detected, thereby detecting changes in SOC-OCV curve due to battery deterioration. Configurations other than detecting changes in internal resistance of battery are same as those of the embodiment 1. Thus the difference from the embodiment 1 will be mainly described below.

Figure 18:
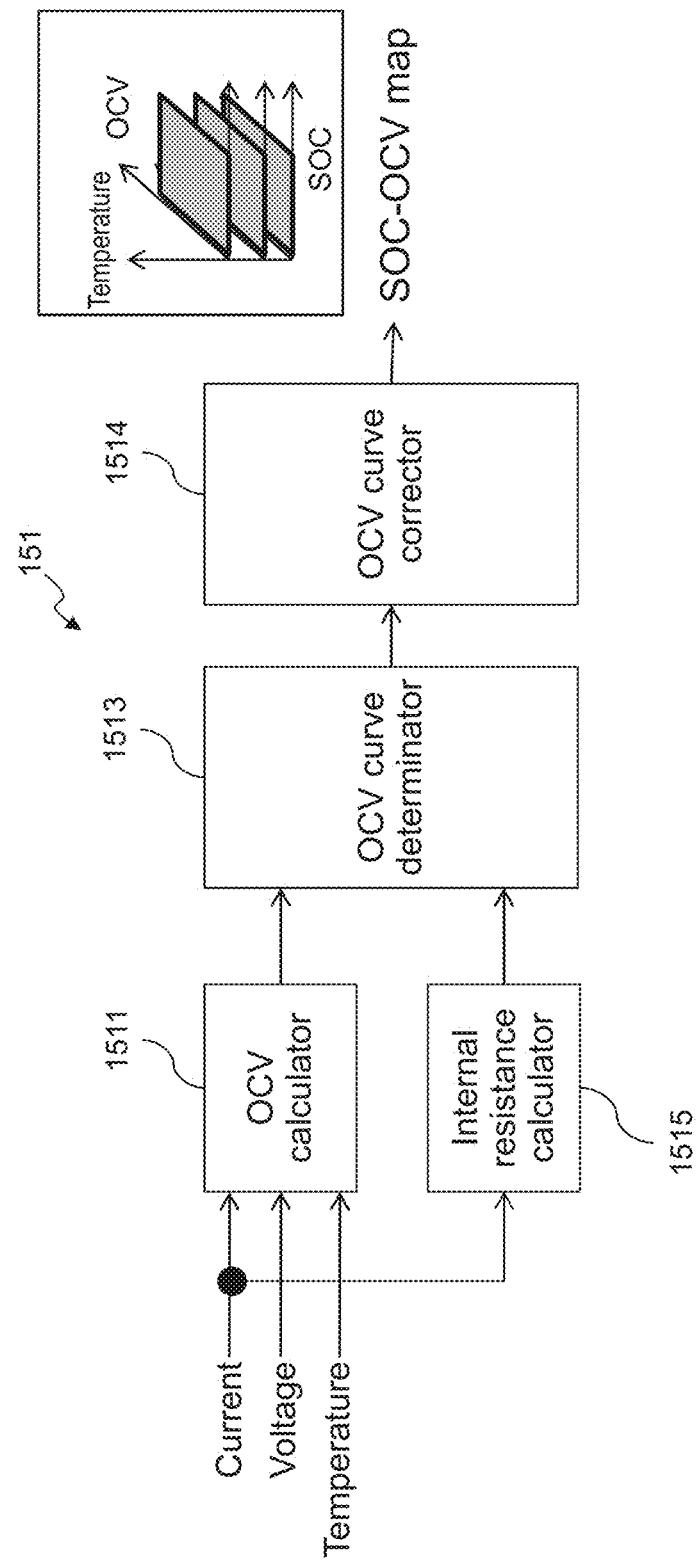
FIG. 18 is a configuration diagram of the OCV curve decider 151 in an embodiment 2.

FIG. 18 is a configuration diagram of the OCV curve decider 151 in the embodiment 2. In the embodiment 2, the OCV curve decider 151 includes an internal resistance calculator 1515 instead of the residual capacity calculator 1512. The internal resistance calculator 1515 calculates internal resistances of the cell battery 111 using such as R1(SOC, T) described in Equations 2-3.

Figure 19:
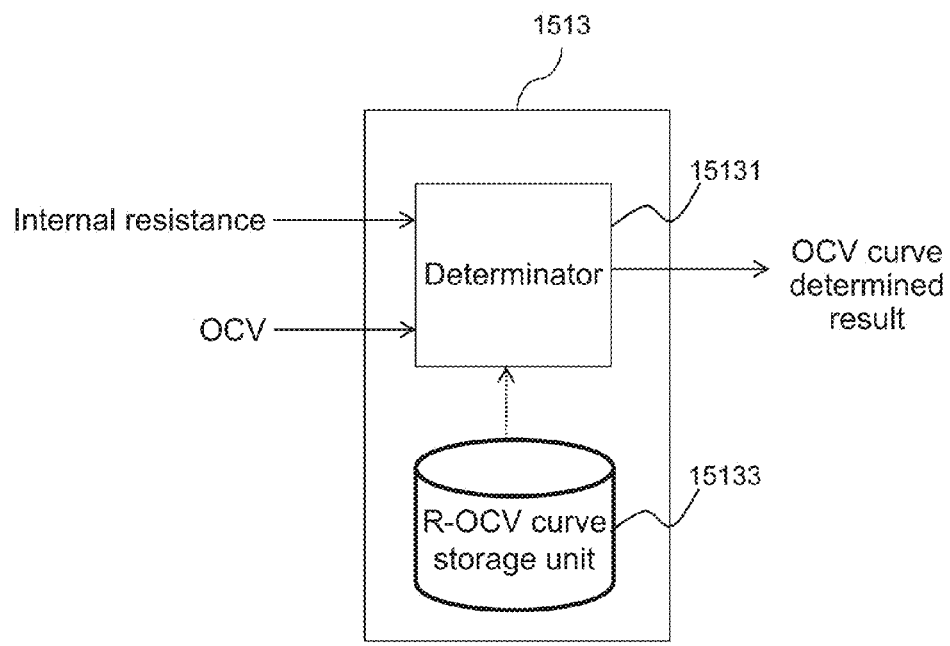
FIG. 19 is a configuration diagram of the OCV curve determinator 1513 in an embodiment 2.

FIG. 19 is a configuration diagram of the OCV curve determinator 1513 in the embodiment 2. In the embodiment 2, the OCV curve determinator 1513 includes a R-OCV curve storage unit 15133 instead of the Q-OCV curve storage unit 15132.

Figure 20:
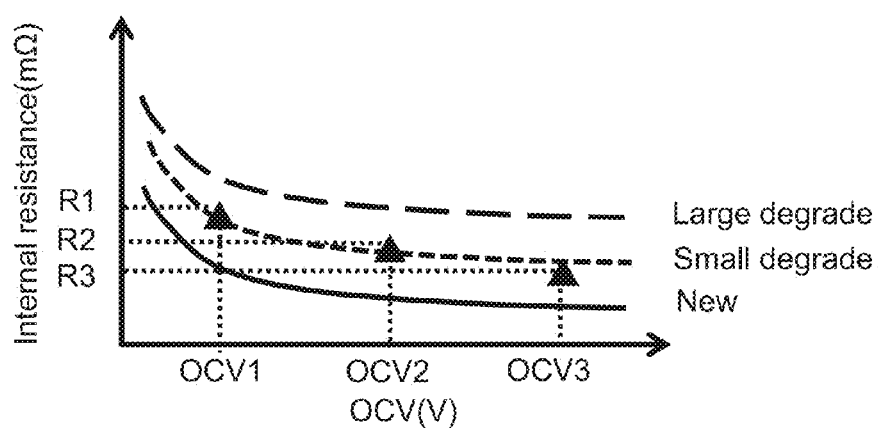
FIG. 20 is a diagram showing an example of R-OCV curve describing a relationship between internal resistance R of battery and OCV stored in a R-OCV curve storage unit 15133.

FIG. 20 is a diagram showing an example of R-OCV curve describing a relationship between internal resistance R of battery and OCV stored in the R-OCV curve storage unit 15133. Since internal resistance of battery changes along with deterioration of the battery, it is possible to detect deterioration of battery by detecting changes in internal resistances. Thus the R-OCV curve storage unit 15133 stores a plurality of patterns of R-OCV curves, and the determinator 15131 identifies a R-OCV curve corresponding to the current state of health as in the embodiment 1 where residual capacity Q is used to identify Q-OCV curve. The OCV curve corrector 1514 selects a SOC-OCV curve corresponding to the identified R-OCV curve.

Embodiment 3

The embodiment 1 acquires, in the next car activation, a pair of stable no-load voltage at the time when the vehicle is activated and residual capacity acquired at the last time when the vehicle stopped. In order to detect changes in SOC-OCV curve, it is preferable to acquire the pair so that the residual capacities distribute uniformly within wide range from large capacity to small capacity. However, vehicle users use the battery in various ways. Thus the pair of residual capacity and OCV may not be always acquired at the time appropriate for acquiring SOC-OCV curve. It also applies to acquiring the pair of internal resistance and OCV in the embodiment 2. On the other hand, it is possible to control the charge/discharge operations on the battery control device's side while the battery charger 420 is charging the battery.

Thus in an embodiment 3 of the present invention, a configurational example will be described in which the operations of the embodiments 1 are performed during the battery charger 420 is charging the battery. Other configurations are same as those of the embodiments 1. Thus differences from the embodiments 1 will be mainly described below. In the embodiment 3, it is also possible to perform the operation described in the embodiment 2.

Figure 21:
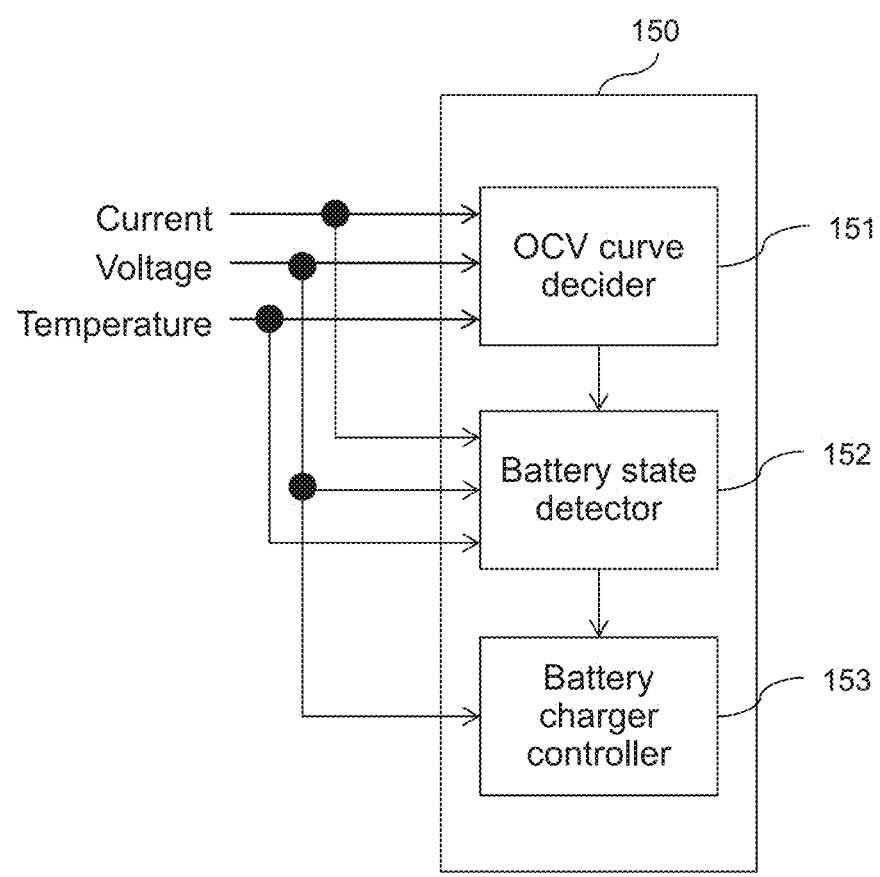
FIG. 21 is a configuration diagram of the assembled battery controller 150 in an embodiment 3.

FIG. 21 is a configuration diagram of the assembled battery controller 150 in the embodiment 3. In the embodiment 3, the assembled battery controller 150 includes a battery charger controller 153 in addition to the configurations described in the embodiments 1. The battery charger controller 153 controls operations of the battery charger 420. The battery charger controller 153 is added also in the configuration of the embodiment 2.

Figure 22:
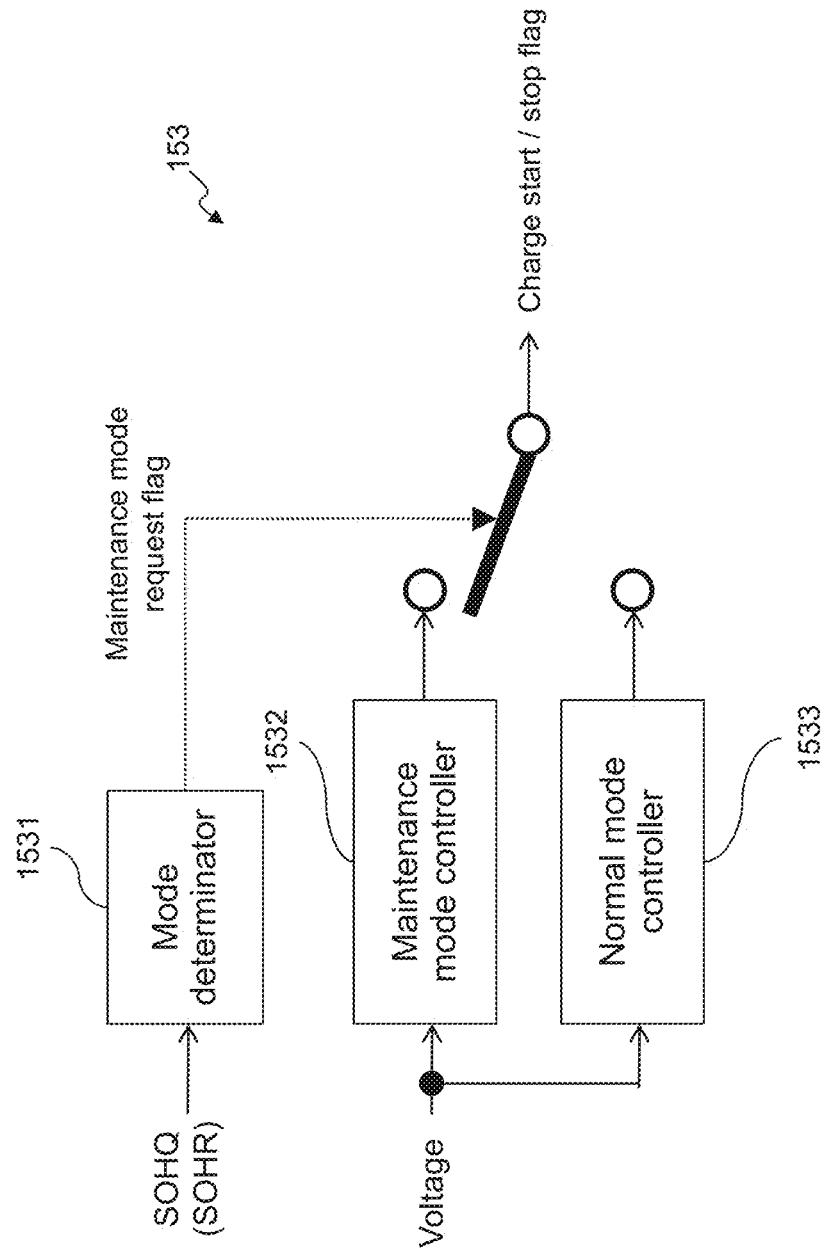
FIG. 22 is a configuration example of a battery charger controller 153.

FIG. 22 is a configuration example of the battery charger controller 153. The battery charger controller 153 includes a mode determinator 1531, a maintenance mode controller 1532, and a normal mode controller 1533. The mode determinator 1531 determines whether the maintenance mode described in FIG. 25 later is performed according to the state of health of the battery (SOHR calculated by using internal resistance of battery or SOHQ calculated by using maximum capacity of battery). While performing the maintenance mode, the maintenance mode controller 1532 controls operations of the battery charger 420. In other normal mode, the normal mode controller 1533 controls operations of the battery charger 420. The reason why the mode is switched will be described in FIG. 25 later.

Figure 23:
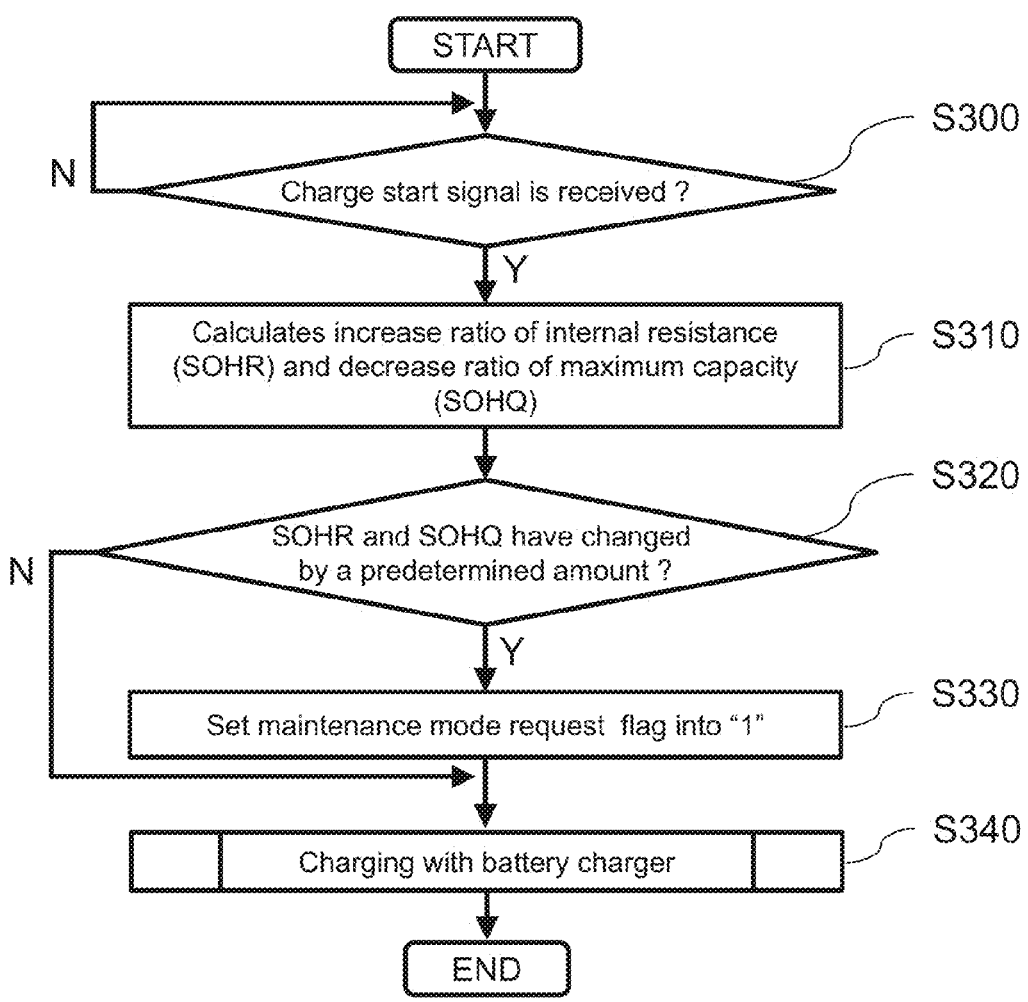
FIG. 23 is an operational flowchart of the battery charger controller 153.

FIG. 23 is an operational flowchart of the battery charger controller 153. Hereinafter, each step in FIG. 23 will be described. The flowchart below assumes that SOHR or SOHQ is acquired before starting the charge and is stored in the storage unit 180.

(FIG. 23: Step S300)

The battery charger controller 153 determines whether a charge start signal is received indicating whether the battery charger is connected. If the signal is received, the process proceeds to step S310. If not received, the battery charger controller 153 waits for the signal.

(FIG. 23: Step S310)

The battery charger controller 153 reads out a current SOHR or a current SOHQ acquired in advance.

(FIG. 23: Step S320)

The mode determinator 1531 determines whether SOHR and SOHQ calculated in step S310 have changed by a predetermined value or by more than that from the previous reselection of SOC-OCV table (in first execution, from the initial shipment), i.e. whether the battery deterioration has progressed by a predetermined value or more than that. If SOHR and SOHQ have changed by a predetermined value or by more than that, the process proceeds to step S330. Otherwise the process proceeds to step S340. Only one of SOHR and SOHQ may be used.

(FIG. 23: Steps S330-S350)

The mode determinator 1531 sets a maintenance mode request flag into "1" instructing to perform the maintenance mode (S330). The battery charger controller 153 performs a charge operation according to the flowchart described in FIG. 24 (S340).

Figure 24:
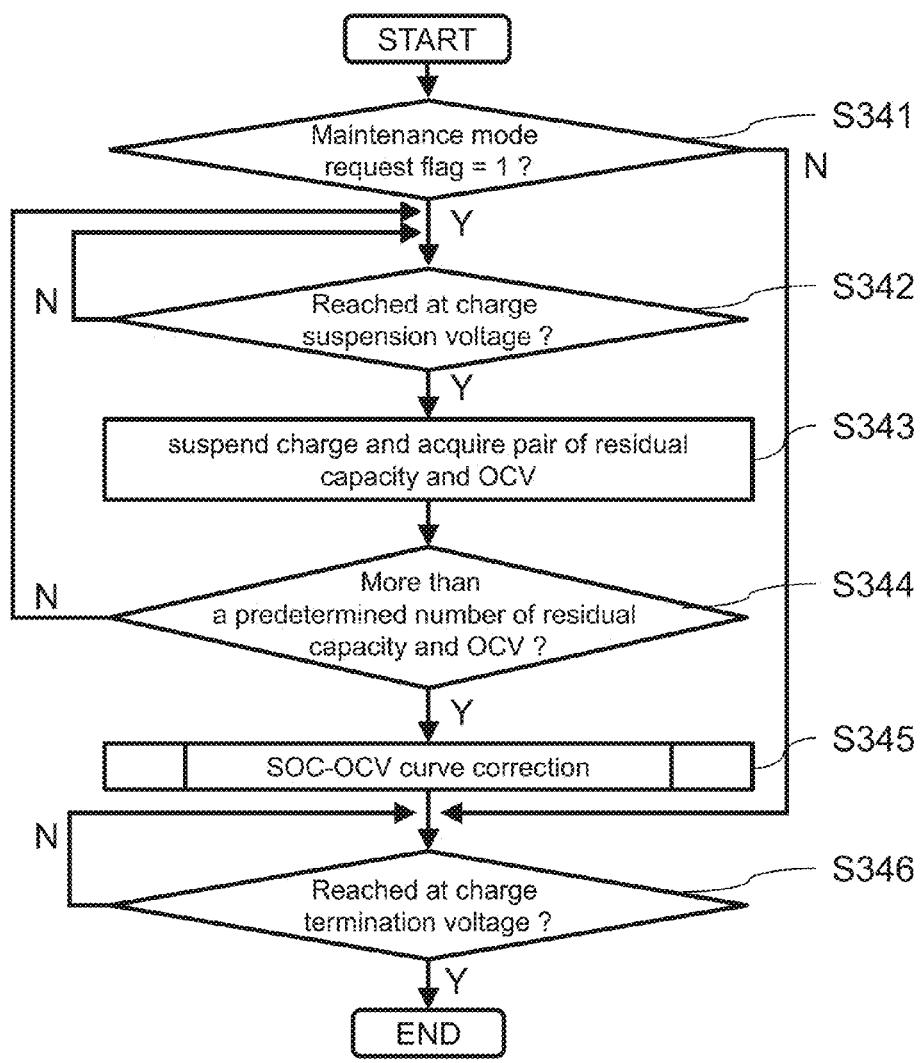
FIG. 24 is a flowchart showing details of step S350.

FIG. 24 is a flowchart showing details of step S340. Hereinafter, each step in FIG. 24 will be described.

(FIG. 24: Step S341)

The battery charger controller 153 checks whether the maintenance mode request flag is "1". If the flag is "1", the process proceeds to step S342. Otherwise the process skips to step S346.

(FIG. 24: Step S342)

The battery charger controller 153 starts charging the battery using the battery charger 420. Then the battery charger controller 153 determines whether the battery voltage has reached a charge suspension voltage described in FIG. 25 later. If the battery voltage has reached the charge suspension voltage, the process proceeds to step S343. Otherwise the battery charger controller continues charging.

(FIG. 24: Steps S343-S344)

The battery charger controller 153 temporarily suspends the charging operation and acquires a pair of residual capacity Q and OCV (S343). If the number of acquired pairs of residual capacity Q and OCV has reached at or above a predetermined number, the process proceeds to step S345. Otherwise the process returns to step S342 (S344).

(FIG. 24: Steps S345-S346)

The determinator 15131 reselects a SOC-OCV curve using the same method as in step S150 (S345). The battery charger controller 153 restarts the charging operation and continues it until the battery voltage reaches a charge termination voltage (S346).

Figure 25:
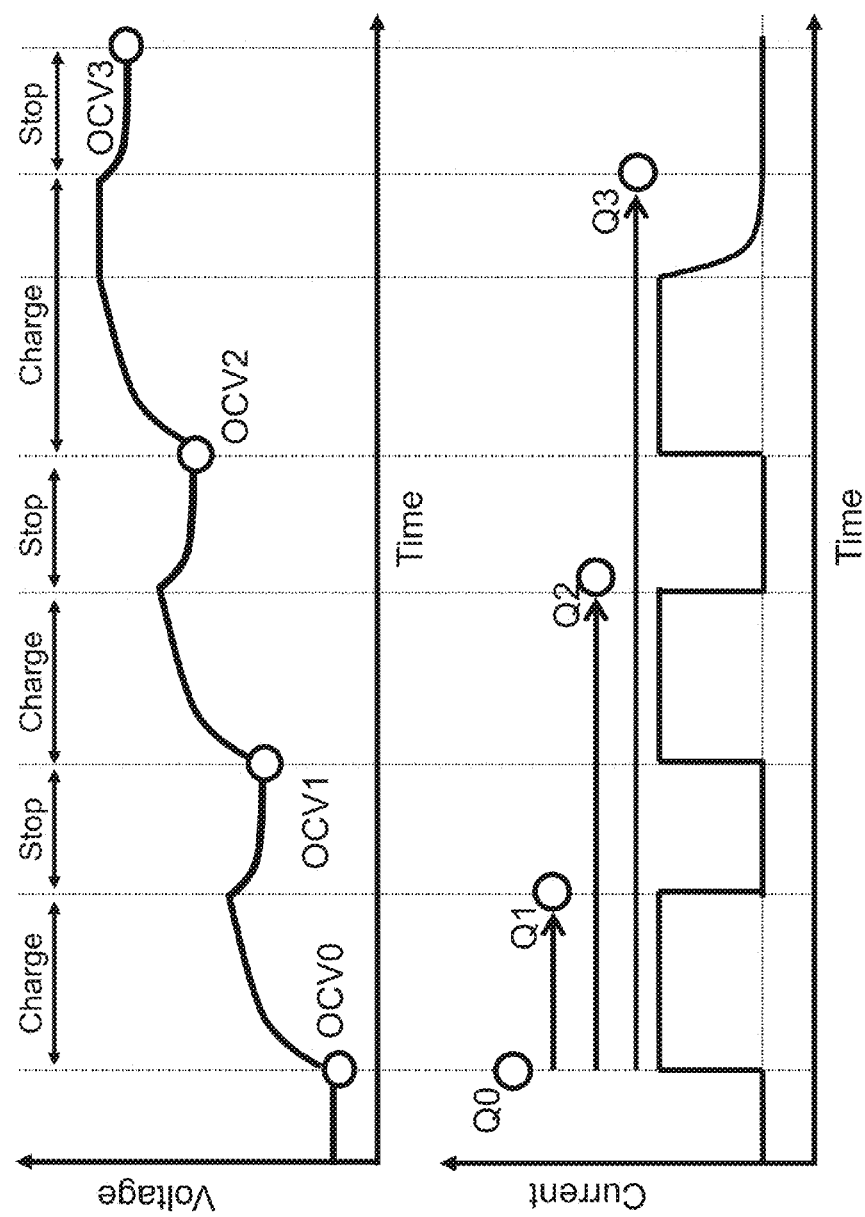
FIG. 25 is a diagram showing an example of operation for the battery charger controller 153 to acquire a pair of residual capacity Q and OCV in step S353.

FIG. 25 is a diagram showing an example of operation for the battery charger controller 153 to acquire a pair of residual capacity Q and OCV in step S343. In the embodiment 3, the battery charger controller 153 acquires pairs of residual capacity Q and OCV at the time when the battery charger 420 stops charging the battery instead of at the time when the vehicle stops. The operation of the battery charger 420 may be controlled by the battery charger controller 153, thus it is possible to more flexibly acquire pairs of residual capacity Q and OCV.

However, as shown in FIG. 25, it is necessary to suspend the charge operation for acquiring pairs of residual capacity Q and OCV. Thus the charging duration is longer than normal charging operations. Therefore, the operation of FIG. 25 is not performed until the time when the battery deterioration has progressed. When it is determined that the battery deterioration has progressed in step S320, the operation of FIG. 25 is performed. Accordingly, it is possible not to prevent the charging operation in the normal mode.

Embodiment 3: Summary

As discussed thus far, the battery control device according to the embodiment 3: switches the operational mode of the battery charger controller 153 at the time when the battery deterioration has progressed to some extent; and then acquires a pair of residual capacity Q and OCV to reselect SOC-OCV curve. Accordingly, it is possible to update SOC-OCV curve into more precise one without depending on the running state of the vehicle.

Embodiment 4

In the embodiments 1-3: the SOC-OCV curve storage unit 15142 previously stores a plurality of patterns of SOC-OCV curves; and a SOC-OCV curve corresponding to the residual capacity Q or corresponding to deteriorated degree of internal resistance R is selected. Alternatively, the SOC-OCV curve storage unit 15142 may only store a single SOC-OCV curve; the OCV curve may be corrected by a predetermined amount when a predetermined value of shift or a shift more than that is detected in the relationship between residual capacity and OCV.

Specifically, when a shift is detected in SOC-OCV curve, a correction amount (e.g. 1 mV) is added to the original SOC-OCV curve. This process is repeated until the difference from the originally implemented relationship between residual capacity and OCV becomes sufficiently small. Note that the direction of shift (polarity) in SOC-OCV curve may vary depending on the SOC. Thus it is necessary to previously inspect the SOC-OCV curve and to configure the correction amount according to the inspection.

The present invention is not limited to the embodiments, and various modified examples are included. The embodiments are described in detail to describe the present invention in an easily understood manner, and the embodiments are not necessarily limited to the embodiments that include all configurations described above. Part of the configuration of an embodiment can be replaced by the configuration of another embodiment. The configuration of an embodiment can be added to the configuration of another embodiment. Addition, deletion, and replacement of other configurations are also possible for part of the configurations of the embodiments.

The configurations, the functions, the processing units, the processing means, etc., may be realized by hardware such as by designing part or all of the components by an integrated circuit. A processor may interpret and execute programs for realizing the functions to realize the configurations, the functions, etc., by software. Information, such as programs, tables, and files, for realizing the functions can be stored in a recording device, such as a memory, a hard disk, and an SSD (Solid State Drive), or in a recording medium, such as an IC card, an SD card, and a DVD.

REFERENCE SIGNS LIST

100: battery system
110: assembled battery
111: cell battery
112: cell battery group
120: cell battery manager
121: cell battery controller
122: voltage detection circuit
123: control circuit
124: signal input/output circuit
125: temperature detector
130: electric current detector
140: electric voltage detector
150: assembled battery controller
151: OCV curve decider
152: battery state detector
153: battery charger controller
160: signal communication means
170: insulating element
180: storage unit
200: vehicle controller
300-330: relays
400: inverter
410: motor generator
420: battery charger

The invention claimed is:

1. A battery control device comprising:
a first memory that stores a plurality of SOC-OCV characteristics, wherein each of the plurality of SOC-OCV characteristics indicates a relationship between an open circuit voltage (OCV), a temperature and a state of charge of battery;
a second memory that stores a plurality of relationships between a residual capacitance and the OCV;
a signal communication means that is communicatively coupled to a cell battery controller;
a voltage detector electrically connected to an assembled battery, wherein the assembled battery includes a plurality of electrically connected batteries;
a current detector electrically connected to the assembled battery that measures an electric current flowing through the assembled battery; and
a processor communicatively coupled to the first and second memory, the signal communication means, the voltage detector and the current detector;
wherein the processor;
acquires a first voltage from the voltage detector,
acquires a first current from current detector,
calculates a first OCV based on the first voltage and the first current,
determines a first residual capacity for the assembled battery based on the first current,
retrieves from the first memory a particular SOC-OCV characteristic based on the first OCV and the first residual capacity,
determining if the particular SOC-OCV characteristic has varied based on the first OCV and the first residual capacity,
selects a different SOC-OCV characteristic as a selected SOC-OCV characteristic if the particular SOC-OCV is determined to vary,
selects the particular SOC-OCV characteristic as the selected SOC-OCV characteristic if the particular is determined to not vary, and
automatically controls the charge and discharge of the assembled battery based on the selected SOC-OCV characteristic.

2. The battery control device according to claim 1, wherein the first residual capacity is determined by integrating the electric current flowing through the battery.

3. The battery control device according to claim 1, wherein the processor further:
calculates an internal resistance of the assembled battery, and
the process determines if the particular SOC-OCV characteristic has varied based on the internal resistance.

4. The battery control device according to claim 1, wherein the processor further:
determines a state of health of the battery based on the selected SOC-OCV characteristic, and
if that state of health of the battery has reached a predetermined degree suspends charging of the assembled battery.

5. The battery control device according to claim 4, wherein if the state of health of the battery has not reached the predetermined degree, the process does not suspend charging of the assembled battery.

6. The battery control device according to claim 2, wherein the process further corrects the selected SOC-OCV characteristic by a predetermined amount according to a state of health of the assembled battery.

* * * * *